United States Patent
Izumi

(10) Patent No.: US 8,217,443 B2
(45) Date of Patent: Jul. 10, 2012

(54) SEMICONDUCTOR DEVICE INCLUDING A FLOATING GATE

(75) Inventor: Naoki Izumi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/470,439

(22) Filed: May 21, 2009

(65) Prior Publication Data

US 2009/0289294 A1 Nov. 26, 2009

(30) Foreign Application Priority Data

May 23, 2008 (JP) ................................. 2008-135514

(51) Int. Cl.
*H01L 29/788* (2006.01)
(52) U.S. Cl. ...... 257/316; 257/315; 257/314; 257/E29.3
(58) Field of Classification Search .................. 257/316, 257/315, 314, E29.3
See application file for complete search history.

(56) References Cited

U.S. PATENT DOCUMENTS

| | | | | |
|---|---|---|---|---|
| 4,796,228 A * | 1/1989 | Baglee | ...................... | 365/185.28 |
| 5,486,714 A * | 1/1996 | Hong | .............................. | 257/321 |
| 5,717,635 A * | 2/1998 | Akatsu | ...................... | 365/185.05 |
| 6,147,377 A * | 11/2000 | Liu | ................................ | 257/314 |
| 6,287,907 B1 | 9/2001 | Ito et al. | | |
| 6,534,355 B2 | 3/2003 | Ito et al. | | |
| 7,767,530 B2 * | 8/2010 | Cho | ............................... | 438/270 |
| 2003/0015764 A1 * | 1/2003 | Raaijmakers et al. | ........ | 257/424 |

FOREIGN PATENT DOCUMENTS

JP 2000-164834 6/2000

* cited by examiner

*Primary Examiner* — Bradley K Smith
*Assistant Examiner* — Mohammad T Karimy
(74) *Attorney, Agent, or Firm* — Rabin & Berdo, P.C.

(57) ABSTRACT

A semiconductor device includes a semiconductor layer having a trench; a source region formed in a surface layer portion thereof adjacently to a first side of the trench; a drain region formed in the surface layer portion adjacently to a second side of the trench; a first insulating film formed in the trench; a floating gate stacked on the first insulating film and opposed to the trench, and extending over and covering only partially the source and drain regions; a second insulating film formed on the floating gate; and a control gate at least partially embedded in the trench so that a portion embedded in the trench is opposed to the floating gate through the second insulating film. The first insulating film has a thin portion in contact with the drain region and a thick portion formed by the remainder thereof which covers the entire bottom surface of the trench.

10 Claims, 23 Drawing Sheets

SEMICONDUCTOR DEVICE INCLUDING A FLOATING GATE

BACKGROUND OF THE INVENTION

1. Field of the Invention

The present invention relates to a semiconductor device including a floating gate nonvolatile storage element.

2. Description of Related Art

An EEPROM (Electrically Erasable Programmable Read Only Memory) is known as a typical nonvolatile memory.

FIG. 13 is a schematic plan view of a conventional EEPROM. FIG. 14 is a schematic sectional view of the EEPROM taken along a line XIII-XIII in FIG. 13.

An EEPROM 121 includes a plurality of memory cells arrayed in the form of a matrix in a direction X and a direction Y orthogonal thereto. Each memory cell includes an N-type first diffusion region, an N-type second diffusion region 124 and an N-type third diffusion region 125 formed in the surface layer portion of a P-type silicon substrate 122 at intervals in the direction x. A first insulating film is laminated on the silicon substrate 122. Each memory cell further includes a floating gate 126 and a select gate 127 formed on the first insulating film. The floating gate 126 is formed to extend over the first diffusion region 123 and the second diffusion region 124 in plan view. A control gate 129 is provided on the floating gate 126 through a second insulating film 128. The control gate 129 is formed to cover the upper surface and the side surfaces of the floating gate 126. On a position where the second diffusion region 124 and the floating gate 126 are opposed to each other, the first insulating film is partially removed, and then a tunnel window (a tunnel insulating film) 130 generally rectangular in plan view is formed at the removed portion. The tunnel window 130 is thinner than the first insulating film. On the other hand, the select gate 127 is formed to extend over the second diffusion region 124 and the third diffusion region 125 in plan view.

Thus, each memory cell has a memory transistor consisting of the first diffusion region 123, the second diffusion region 124, the first insulating film, the floating gate 126, the second insulating film 128 and the control gate 129. Further, each memory cell has a select transistor consisting of the second diffusion region 124, the third diffusion region 125, the first insulating film and the select gate 127.

A bit line 131 extending in the direction X is provided above the control gate 129 through an inter layer dielectric film. The bit line 131 is connected to the third diffusion regions 125 (drain regions of the select transistors) of the memory cells arrayed in the direction X under the same through contact plugs 132. The control gates 129 of the memory cells arrayed in the direction Y are integrated into a word line extending in the direction Y. The select gates 127 of the memory cells arrayed in the direction Y are integrated into a select line extending in the direction Y. The first diffusion regions 123 (source regions of the memory transistors) of the memory cells arrayed in the direction Y are integrated into a source line extending in the direction Y.

Referring to FIGS. 13 and 14, illustration of the first insulating film and the inter layer dielectric film is omitted.

As shown in FIG. 13, each pair of memory cells adjacent to each other in the direction X have symmetrical structures with respect to a straight line extending there between in the direction Y. The first diffusion region 123 is shared by the memory cells provided on both sides of the first diffusion region 123 in the direction X as the source regions of the memory transistors. Thus, the cell size (the area of each memory cell) is reduced.

However, further increase in capacity and downsizing are required to a nonvolatile memory such as an EEPROM, and the cell size must be further reduced in order to satisfy the requirements.

SUMMARY OF THE INVENTION

An object of the present invention is to provide a semiconductor device allowing further reduction of a cell size.

A semiconductor device according to an aspect of the present invention includes: a semiconductor layer; a trench dug downward from the surface of the semiconductor layer; a source region formed on the surface layer portion of the semiconductor layer adjacently to a first side of the trench in a prescribed direction; a drain region formed on the surface layer portion of the semiconductor layer adjacently to a second side of the trench opposite to the first side in the prescribed direction; a first insulating film formed on the bottom surface and the side surface of the trench; a floating gate stacked on the first insulating film and opposed to the bottom surface and the side surface of the trench through the first insulating film; a second insulating film formed on the floating gate; and a control gate at least partially embedded in the trench so that the portion embedded in the trench is opposed to the floating gate through the second insulating film.

In the semiconductor device, the trench is dug in the semiconductor layer downward from the surface thereof. The source region and the drain region are formed on the surface layer portion of the semiconductor layer. The source region is formed on the first side of the trench in the prescribed direction, and adjacent to the trench. The drain region is formed on the side of the trench opposite to the source region in the prescribed direction, and adjacent to the trench. The first insulating film is formed on the bottom surface and the side surface of the trench. The floating gate is provided on the first insulating film. The floating gate is opposed to the bottom surface and the side surface of the trench through the first insulating film. The second insulating film is formed on the floating gate. The control gate is provided on the second insulating film. The control gate is at least partially embedded in the trench. The portion of the control gate embedded in the trench is opposed to the floating gate through the second insulating film.

The source region, the drain region, the first insulating film, the floating gate, the second insulating film and the control gate constitute a nonvolatile storage element (a floating gate memory transistor). The first insulating film is in contact with the drain region on the side surface of the trench. The floating gate is opposed to the drain region through a portion of the first insulating film in contact with the drain region. Therefore, charges stored in the floating gate FN (Fowler-Nordheim)-tunnel through the portion of the first insulating film in contact with the drain region. In other words, a tunnel window (a tunnel insulating film) is arranged on the side surface of the trench in the nonvolatile storage element provided on the semiconductor device. Thus, no planar space is required for the tunnel window. Therefore, the cell size can be reduced by at least the space as compared with the structure (see FIG. 14) having the tunnel window opposed to the surface of the drain region.

In the structure having the tunnel window opposed to the surface of the drain region, the drain region is arranged under the floating gate. Therefore, the drain region is formed in advance of the formation of the floating gate. More specifically, the drain region is formed by forming a resist pattern selectively exposing a portion defining the drain region on the semiconductor layer and doping the surface layer portion of the semiconductor layer with an impurity through the resist pattern serving as a mask in advance of the formation of the floating gate. In the structure having the tunnel window opposed to the surface of the drain region, further, the tunnel window is formed by partially reducing the thickness of the insulating film provided on the semiconductor layer. In order to partially reduce the thickness of the insulating film, a resist pattern selectively exposing the portion to be reduced in thickness is formed on the insulating film, and the insulating film is etched through the resist pattern serving as a mask.

In the structure according to the present invention, on the other hand, the source region and the drain region are arranged on side portions of the floating gate, and hence the source region and the drain region can be formed by doping the whole area of an active region (a region exposed from an element isolation region) of the semiconductor layer with an impurity. Therefore, no resist patterns are required for forming the source region and the drain region. Further, the portion of the first insulating film in contact with the drain region forms the tunnel window, whereby the portion of the first insulating film forming the tunnel window may not be selectively etched, and no resist pattern is required therefor. Therefore, the number of reticles necessary for manufacturing the semiconductor device can be reduced. Consequently, the number of manufacturing steps and the manufacturing cost can be reduced.

Preferably, the first insulating film has a thin portion, having a relatively small thickness, in contact with the drain region and a thick portion, having a relatively large thickness, formed by the remaining portion of the first insulating film other than the thin portion.

FN tunneling of charges can be excellently caused due to the formation of the thin portion. On the other hand, the capacitance between the floating gate and the semiconductor layer can be reduced due to the formation of the thick portion, whereby the coupling ratio (the ratio of the capacitance between the floating gate and the control gate to the sum of the capacitance between the floating gate and the control gate and the capacitance between the floating gate and the semiconductor layer) can be improved.

More preferably, the thick portion has a first thick portion formed on the side surface of an opening-side end portion of the trench and continuous with the thin portion and a second thick portion formed on a side opposite to the first thick portion through the thin portion and continuous with the thin portion.

The first thick portion is formed on the side surface of the opening-side end portion of the trench, whereby the thin portion and the first thick portion are in contact with the drain region. Thus, the size of the thin portion causing FN tunneling is reduced, whereby undesired charge escape from the floating gate can be suppressed. Further, the size of the thick portion is enlarged, whereby the coupling ratio can be further improved.

The control gate may be shaped to be inside the second insulating film as viewed from the depth direction of the trench.

The floating gate, the second insulating film and the control gate may protrude beyond the upper end of the trench. In this case, the semiconductor device may further include a third insulating film laminated on the semiconductor layer, and portions of the floating gate, the second insulating film and the control gate protruding beyond the upper end of the trench may be covered with the third insulating film.

The semiconductor device may further include a third insulating film laminated on the semiconductor layer, and the upper ends of the floating gate, the second insulating film and the control gate may be flush with the surface of the third insulating film.

The control gate may be shaped to integrally have a body portion arranged on the trench to protrude from the trench and an extending portion extending sideward from the body portion.

The extending portion is opposed to the floating gate in the depth direction of the trench. When the control gate has the extending portion, therefore, the capacitance between the floating gate and the control gate can be increased, and the coupling ratio can be further improved.

When the control gate has the extending portion, the semiconductor device may further include a third insulating film laminated on the semiconductor layer, and the upper end portion of the second insulating film may extend onto the floating gate and may be arranged on the third insulating film, while the extending portion may be arranged on the third insulating film through the second insulating film.

The foregoing and other objects, features and effects of the present invention will become more apparent from the following detailed description of the embodiments with reference to the attached drawings.

DETAILED DESCRIPTION OF PREFERRED EMBODIMENTS

Embodiments of the present invention are now described with reference to the attached drawings.

Figure 1:
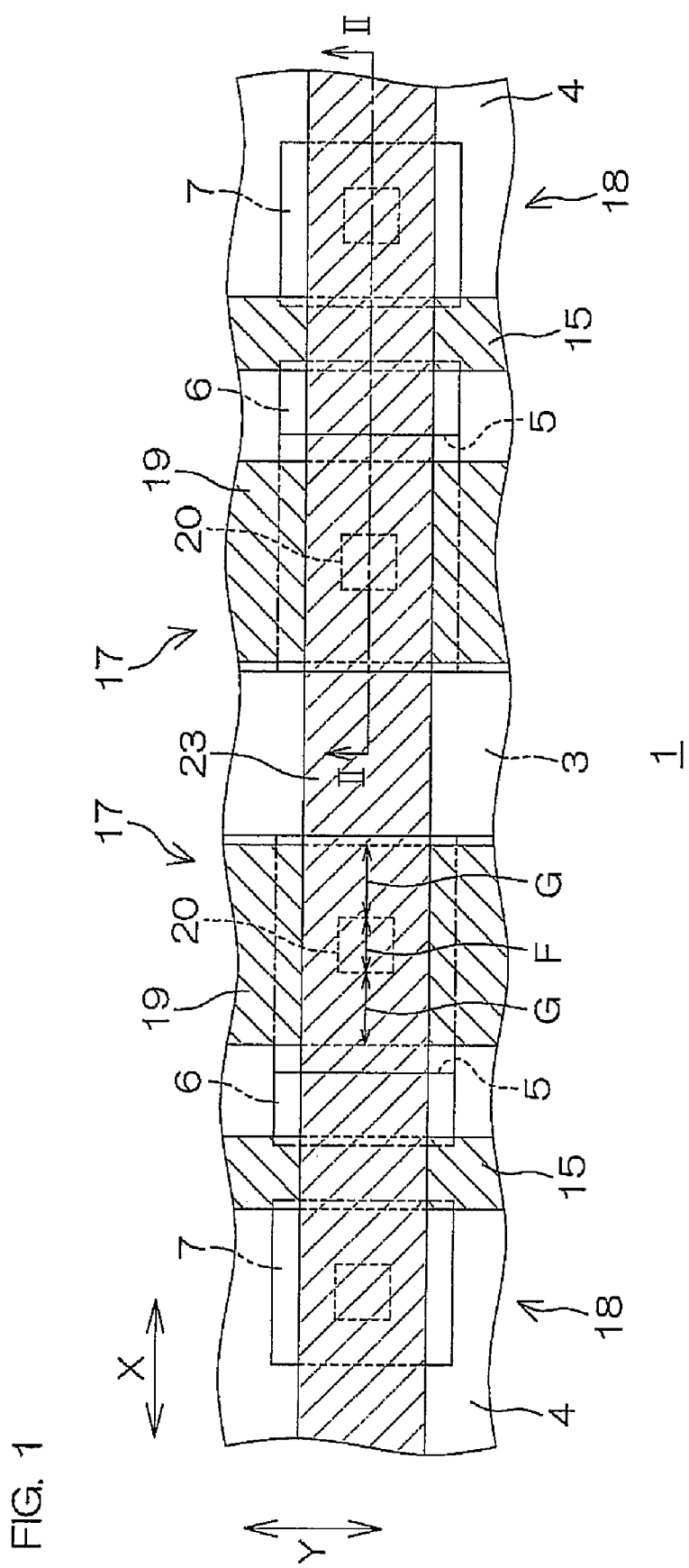
FIG. 1 is a schematic plan view of a semiconductor device according to a first embodiment of the present invention.
Figure 2:
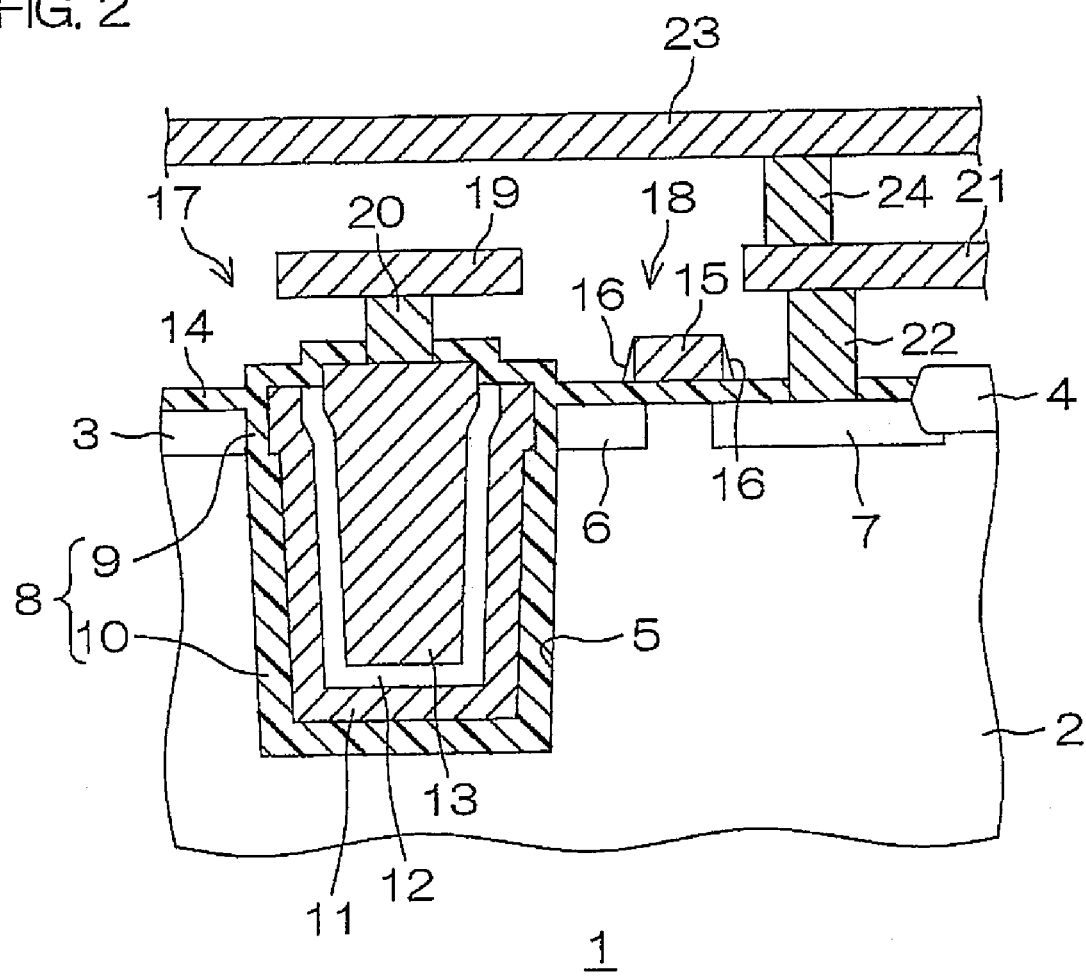
FIG. 2 is a schematic sectional view of the semiconductor device taken along a line II-II in FIG. 1.

FIG. 1 is a schematic plan view of a semiconductor device according to a first embodiment of the present invention. FIG. 2 is a schematic sectional view of the semiconductor device taken along a line II-II in FIG. 1.

A semiconductor device 1 is an EEPROM constituted of a plurality of memory cells arrayed in the form of a matrix in a direction X and a direction Y orthogonal thereto.

The semiconductor device 1 includes a P-type semiconductor layer 2 made of silicon as a substrate thereof.

A plurality of first diffusion regions 3 are formed on the surface layer portion of the semiconductor layer 2 at regular intervals in the direction X. Each first diffusion region 3 is an N-type diffusion region containing an N-type impurity diffused therein, and linearly extends in the direction Y.

On both sides of each first diffusion region 3 in the direction X, a plurality of memory cell regions are alignedly set in the direction Y. Each memory cell region is surrounded by a field oxide film 4 formed on the surface layer portion of the semiconductor layer 2 in a U shape (a U shape having an opening end arranged on the side of the first diffusion region 3 in plan view) opened toward the first diffusion region 3 in plan view, and isolated from memory cell regions adjacent thereto in the direction X.

In each memory cell region, a trench 5 generally tetragonal in plan view is dug in the semiconductor layer 2 downward from the surface thereof. One side surface of the trench 5 in the direction X is in contact with the first diffusion region 3.

In each memory cell region, further, an N-type second diffusion region 6 and an N-type third diffusion region 7 are formed on the surface layer portion of the semiconductor layer 2. The second diffusion region 6 is formed on a side of the trench 5 opposite to the first diffusion region 3, and in contact with another side surface of the trench 5 in the direction X. The third diffusion region 7 is formed on a side of the second diffusion region 6 opposite to the trench 5 at an interval from the second diffusion region 6.

A first insulating film 8 made of silicon oxide is formed on the bottom surface and the side surfaces of the trench 5. The first insulating film 8 is so formed that the thickness of a portion in contact with the first diffusion region 3 and the second diffusion region 6 is relatively small and the thickness of the remaining portion (a portion in contact with the P-type region of the semiconductor layer 2) is relatively large. In other words, the first insulating film 8 integrally includes a thin portion 9, having a relatively small thickness, in contact with the first diffusion region 3 and the second diffusion region 6 and a thick portion 10, having a relatively large thickness, consisting of the remaining portion other than the thin portion 9.

A floating gate 11 made of doped polysilicon (polysilicon doped with an N-type impurity in a high concentration, for example) is formed on the first insulating film 8. The floating gate 11 is opposed to the bottom surface and the side surfaces of the trench 5 through the first insulating film 8.

A second insulating film 12 having an ONO (oxide film-nitride film-oxide film) structure where a silicon nitride film is sandwiched between a pair of silicon oxide films, for example, is formed on the floating gate 11 to cover the overall inner surface of the floating gate 11.

A control gate 13 made of doped polysilicon is provided on the second insulating film 12, to fill up the inner side of the second insulating film 12.

The upper end portions of the floating gate 11, the second insulating film 12 and the control gate 13 protrude upward from the trench 5. The floating gate 11 and the second insulating film 12 protrude from the upper end of the trench 5 (the surface of the semiconductor layer 2) with quantities generally identical to each other, while the control gate 13 protrudes from the trench 5 with a quantity larger than the same. Outside the trench 5, a step is formed between an end surface (the upper surface) of the second insulating film 12 and the surface (the upper surface) of the control gate 13 due to the difference between the quantities of protrusion.

A third insulating film 14 made of silicon oxide is laminated on the semiconductor layer 2. The third insulating film 14 covers the surface of an active region (a region not provided with the field oxide film 4) of the semiconductor layer 2 and the portions of the floating gate 11, the second insulating film 12 and the control gate 13 protruding from the trench 5.

On the third insulating film 14, a select gate 15 made of doped polysilicon is formed on a position opposed to the space between the second diffusion region 6 and the third diffusion region 7. The select gate 15 overlaps with the second diffusion region 6 and the third diffusion region 7 in the direction X in plan view. In other words, both end portions of the select gate 15 in the direction X are opposed to the second diffusion region 6 and the third diffusion region 7 respectively. A sidewall 16 made of silicon nitride or silicon oxide is formed around the select gate 15.

FIG. 1 omits illustration of the third insulating film 14 and the sidewall 16, in order to facilitate understanding of the structure of the semiconductor device 1.

The first diffusion region 3 as well as the second diffusion region 6, the first insulating film 8, the floating gate 11, the second insulating film 12 and the control gate 13 provided on each memory cell region constitute a memory transistor 17 of each memory cell. The first diffusion region 3 and the second diffusion region 6 function as a source region and a drain region of the memory transistor 17 respectively. The second diffusion region 6, the third diffusion region 7, the third insulating film 14 and the select gate 15 provided on each memory cell region constitute a select transistor 18 of each memory cell. The second diffusion region 6 and the third diffusion region 7 function as a source region and a drain region of the select transistor 18 respectively. In other words, each memory cell includes one memory transistor 17 and one select transistor 18.

Two memory cells formed on the first diffusion region 3 and two memory cells on both sides thereof in the direction X have symmetrical structures with respect to a straight line (extending in the direction Y) set there between along the first diffusion region 3, and share the first diffusion region 3 as the source regions of the memory transistors 17.

An inter layer dielectric film (not shown) made of silicon oxide is laminated on the third insulating film 14, the select gate 15 and the sidewall 16. A word line 19 is provided on the inter layer dielectric film. The word line 19 extends in the direction Y to be opposed to the control gates 13 of the memory cells arrayed in the direction Y, and is electrically connected with all control gates 13 opposed thereto through contact plugs 20. More specifically, contact holes (not shown) facing the control gates 13 respectively are penetratingly formed in the third insulating film 14 and the inter layer dielectric film. The contact plugs 20 made of tungsten are embedded in the contact holes respectively. The word line 19 made of aluminum is provided on the inter layer dielectric film to couple the top faces of the contact plugs 20 arrayed in the direction Y with one another. Thus, the word line 19 is connected in common to the control gates 13 of the memory cells arrayed in the direction Y through the contact plugs 20.

A first-layer bit line 21 is further provided on the inter layer dielectric film separately from the word line 19, to extend over two memory cells adjacent to each other in the direction X through the field oxide film 4. Both end portions of the first-layer bit line 21 are connected to the third diffusion regions 7 (the drain regions of the select transistors) of the two memory cells through contact plugs 22. More specifically, contact holes (not shown) facing the third diffusion regions 7 are penetratingly formed in the third insulating film 14 and the inter layer dielectric film. The contact plugs 22 made of tungsten are embedded in the contact holes respectively. The first-layer bit line 21 is provided on the inter layer dielectric film so that both end portions thereof are opposed to the two third diffusion regions 7 adjacent to each other in the direction X through the field oxide film 4. Thus, the first-layer bit line 21 is connected in common to the third diffusion regions 7 of the two memory cells adjacent to each other in the direction X through the field oxide film 4, through the contact plugs 22.

The word line 19 and the first-layer bit line 21 are covered with a second inter layer dielectric film (not shown) made of silicon oxide. A second-layer bit line 23 made of aluminum is provided on the second inter layer dielectric film. The second-layer bit line 23 extends in the direction Y, and is opposed to first bit lines 21 arranged on the same straight line in the direction Y. The second-layer bit line 23 is electrically connected with all first-layer bit lines 23 opposed thereto through vias 24 made of tungsten. Thus, the second-layer bit line 23 is connected in common to the third diffusion regions 7 of the memory cells arrayed in the direction Y through the contact plugs 22, the first-layer bit line 21 and the contact plugs 22.

The select gates 15 of the memory cells arrayed in the direction Y are integrated into a select line extending in the direction Y.

In order to write data in the memory transistor 17 (the memory cell), the first diffusion region 3 (the source region of the memory transistor 17) and the third diffusion region 7 (the second-layer bit line 23) are set to the ground potential (0 V) respectively. Further, a prescribed voltage Vpp (10 to 12 V, for example) is applied to the control gate 13 (the word line 19) and the select gate 15. Thus, the select transistor 18 is turned on, and a high electric field is formed between the second diffusion region 6 (the drain region of the memory transistor 17) and the control gate 13. When the high electric field is formed, electrons are injected from the second diffusion region 6 into the floating gate 11 by FN tunneling through the first insulating film 8, to achieve data writing.

In order to erase the data, on the other hand, the first diffusion region 3 (the source region of the memory transistor 17) is opened, and the control gate 13 is set to the ground potential. Further, a prescribed erasing voltage (the voltage Vpp, for example) is applied to the select gate 15 and the third diffusion region 7 (the drain region of the select transistor 18). Thus, the select transistor 18 is turned on, a high voltage is applied to the second diffusion region 6 (the drain region of the memory transistor 17), and a high electric field is formed between the second diffusion region 6 and the floating gate 11. When the high electric field is formed, electrons are extracted from the floating gate 11 to the second diffusion region 6, to achieve data erasing.

A threshold voltage for allowing the source region and the drain reign of the memory transistor 17 to conduct (a voltage to be applied to the control gate 13 for allowing the source region and the drain region to conduct) varies with a state where electrons are stored in the floating gate 11 and a state where no electrons are stored therein. In other words, the threshold voltage is at a relatively high level Vth(1) when the floating gate 11 stores electrons, and at a relatively low level Vth(0) when the floating gate 11 stores no electrons.

In data reading from the memory transistor 17, a prescribed gate voltage and a prescribed drain voltage are applied to the select gate 15 and the third diffusion region 7 (the drain region of the select transistor 18) respectively, and whereby the select transistor 18 is turned on. The first diffusion region 3 (the source region of the memory transistor 17) is set to the ground potential, and a sense voltage Vsense of an intermediate level between the voltages Vth(1) and Vth(0) is applied to the control gate 13. When a current flows between the source region and the drain region of the memory transistor 17 due to the application of the sense voltage Vsense, a logic signal "0" can be obtained. If no current flows between the source region and the drain region of the memory transistor 17 due to the application of the sense voltage Vsense, on the other hand, a logic signal "1" can be obtained.

As herein above described, the first insulating film 8 is in contact with the second diffusion region 6 serving as the drain region of the memory transistor 17 on the side surface of the trench 5. The floating gate 11 is opposed to the second diffusion region 6 through the portion of the first insulating film 8 in contact with the second diffusion region 6. Therefore, electrons stored in the floating gate 11 FN-tunnel through the portion of the first insulating film 8 in contact with the second diffusion region 6. In other words, a tunnel window (a tunnel insulating film) is arranged on the side surface of the trench 5 in the memory transistor 17. Therefore, no planar space is required for the tunnel window. Thus, the cell size can be reduced by at least the space as compared with the structure shown in FIGS. 13 and 14, i.e., the structure having the tunnel window 130 opposed to the surface of the second diffusion region 124 serving as the drain region of the memory transistor.

Figure 13:
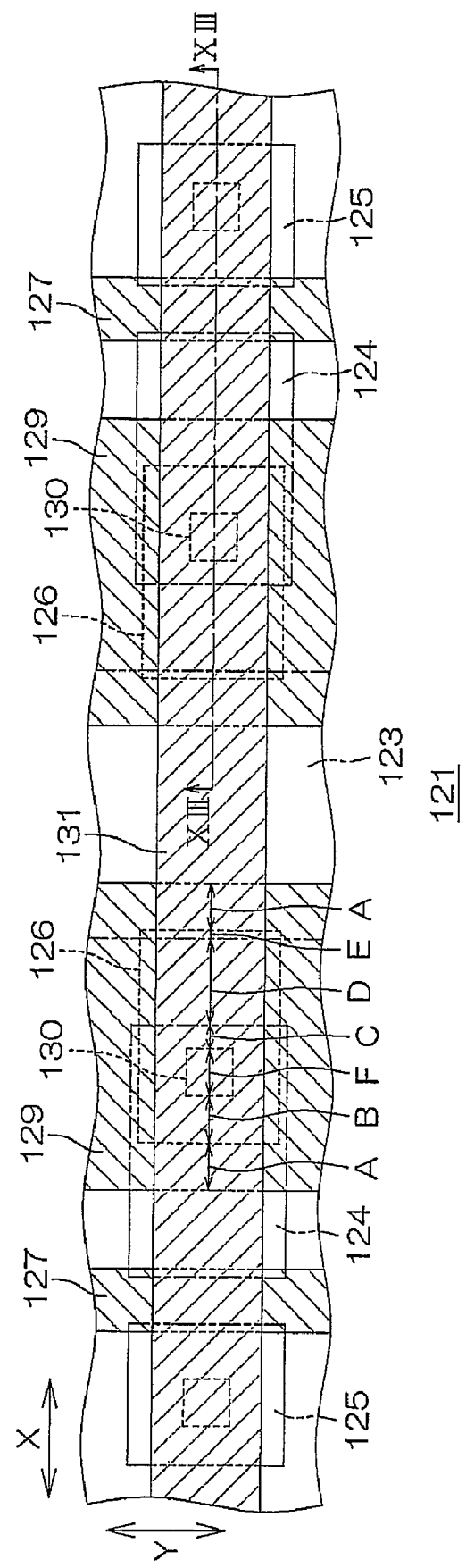
FIG. 13 is a schematic plan view of a conventional EEPROM (semiconductor device).
Figure 14:
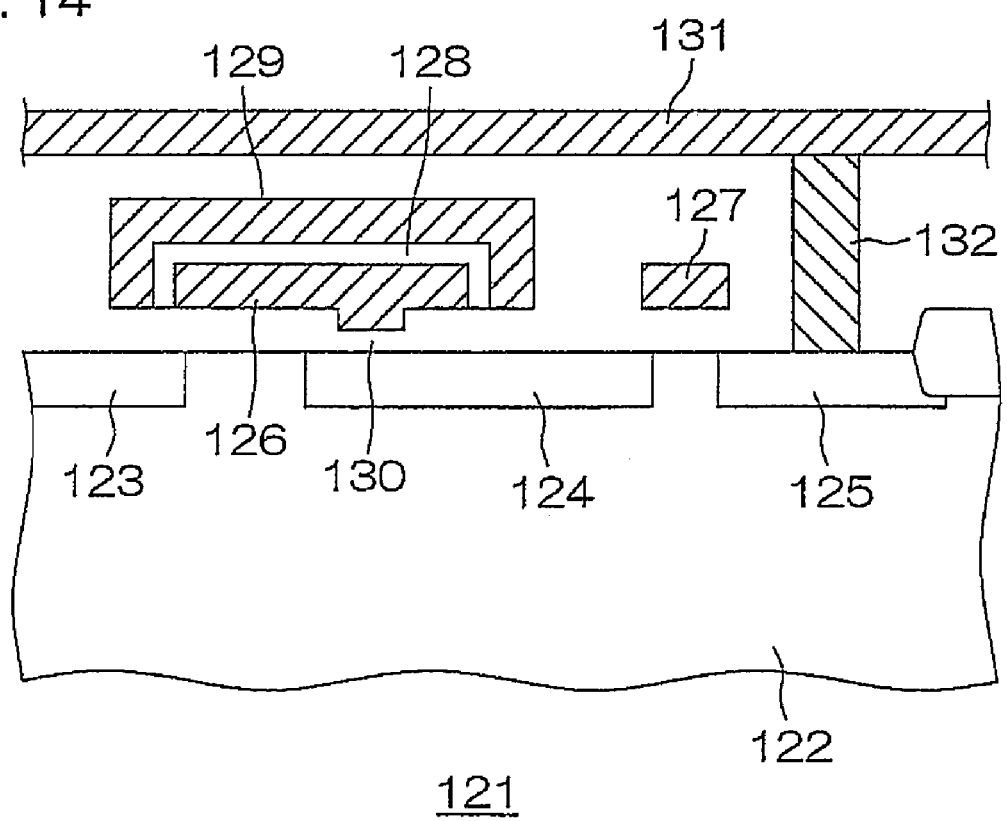
FIG. 14 is a schematic sectional view of the EEPROM taken along a line XIII-XIII in FIG. 13.

In the left memory cell shown in FIG. 13, it is assumed that A denotes the interval between the left edge of the control gate 129 and the left edge of the floating gate 126 and the interval between the right edge of the floating gate 126 and the right edge of the control gate 129. It is also assumed that B denotes the interval between the left edge of the floating gate 126 and the left edge of the tunnel window 130, C denotes the interval between the right edge of the tunnel window 130 and the right edge of the second diffusion region 124, D denotes the interval between the right edge of the second diffusion region 124 and the left edge of the first diffusion region 123 and E denotes the interval between the left edge of the first diffusion region 123 and the right edge of the floating gate 126 respectively. It is also assumed that F denotes a design rule, i.e., the size of the tunnel window 130 in the direction X. In this case, the width W of the control gate 129 (the word line) in the direction X is equal to 2A+B+C+D+E+F. If A=0.375 μm, B=0.375 μm, C=0.375 μm, D=0.75 μm, E=0.3 μm and F=0.6 μm, for example, the width W is equal to 3.15 μm.

In the left memory cell shown in FIG. 1, on the other hand, it is assumed that G denotes the interval between the left edge of the word line 19 and the left edge of the contact plug 20 and the interval between the right edge of the contact plug 20 and the right edge of the word line 19. It is also assumed that the size of the contact plug 20 in the direction X is the design rule F. In this case, the width W of the word line 19 in the direction X is equal to 2G+F. If G=0.4 μm and F=0.6 μm, for example, the width W is equal to 1.4 μm. Thus, in the structure shown in FIG. 1, the width W of the word line 19 can be reduced as compared with the structure shown in FIG. 13, whereby the size of the memory cell in the direction X can be reduced.

The first insulating film 8 integrally has the thin portion 9, having the relatively small thickness, in contact with the first diffusion region 3 and the second diffusion region 6 and the thick portion 10, having the relatively large thickness, consisting of the remaining portion other than the thin portion 9. FN tunneling of electrons can be excellently caused due to the formation of the thin portion 9. On the other hand, the capacitance between the floating gate 11 and the semiconductor layer 22 can be reduced due to the formation of the thick portion 10, whereby a coupling ratio R (the ratio of the capacitance between the floating gate 11 and the control gate 13 to the sum of the capacitance between the floating gate 11 and the control gate 13 and the capacitance between the floating gate 11 and the semiconductor layer 2) can be improved.

If the depth of the trench 5 (the distance from the surface of the semiconductor layer 2 to the bottom surface of the trench 5) is 2.0 µm, the width of the trench 5 in the direction X is 1.4 µm, the depths of the first diffusion region 3 and the second diffusion region 6 are 0.2 µm, the thickness of the thin portion 9 is 0.012 µm, the thickness of the thick portion 10 is 0.1 µm, the thickness of the floating gate 11 is 0.1 µm and the thickness of the second insulating film 12 is 0.02 µm in the structure shown in FIG. 2, for example, the coupling ratio R is expressed as follows:

$R=\{(1.8+1.8+1.0)/0.02\}/[\{(0.2+0.2)/0.012\}+\{(1.7+1.7+1.2)/0.1\}+\{(1.8+1.8+1.0)/0.02\}] \approx 0.74$ Thus, data can be written in and erased from the memory transistor 17 (the memory cell) with the voltage Vpp of a low practical level.

Figure 3A:
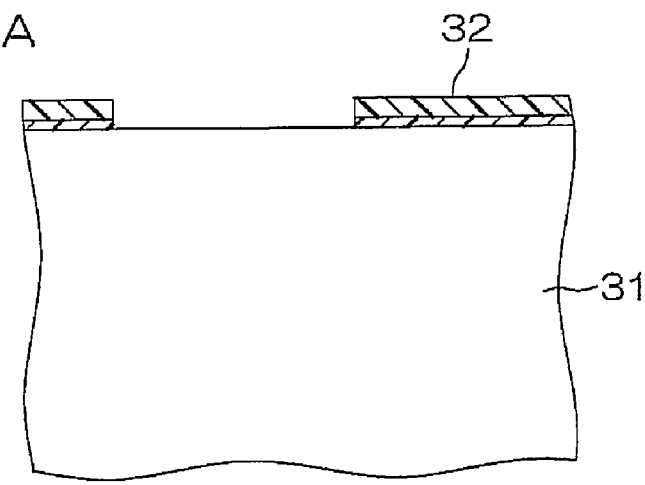
FIGS. 3A to 3O are schematic sectional views for illustrating a method of manufacturing a memory cell of the semiconductor device shown in FIG. 2 in step order.
Figure 3B:
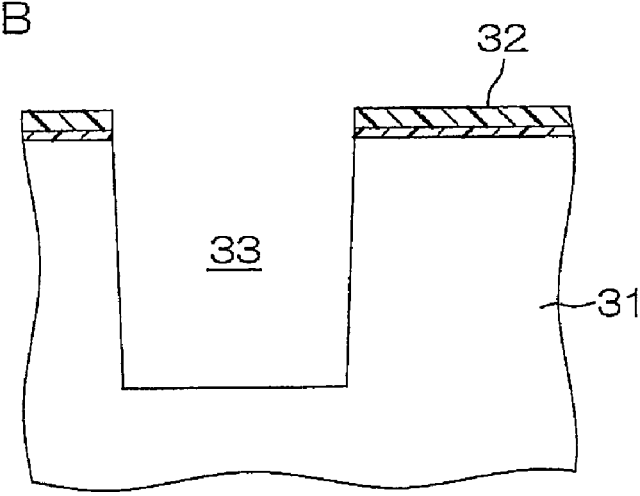
Figure 3C:
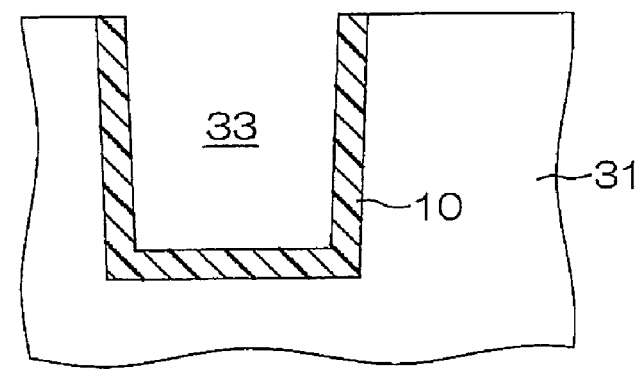
Figure 3D:
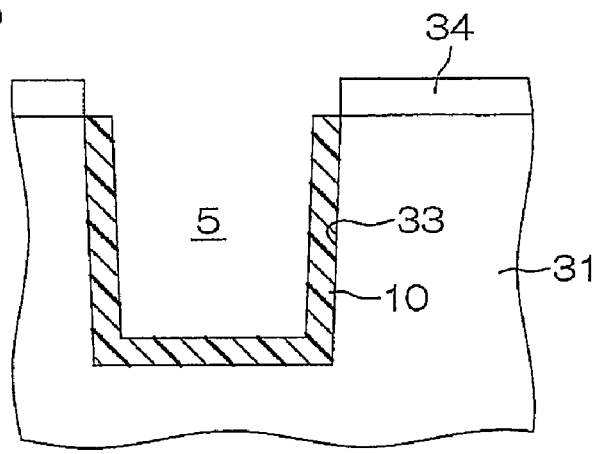
Figure 3E:
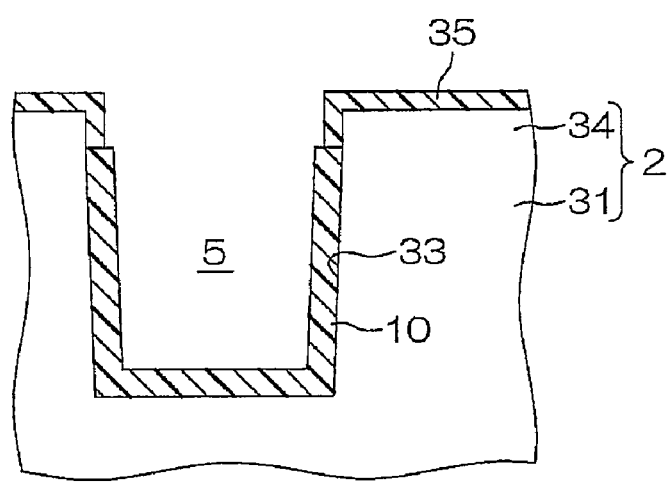
Figure 3F:
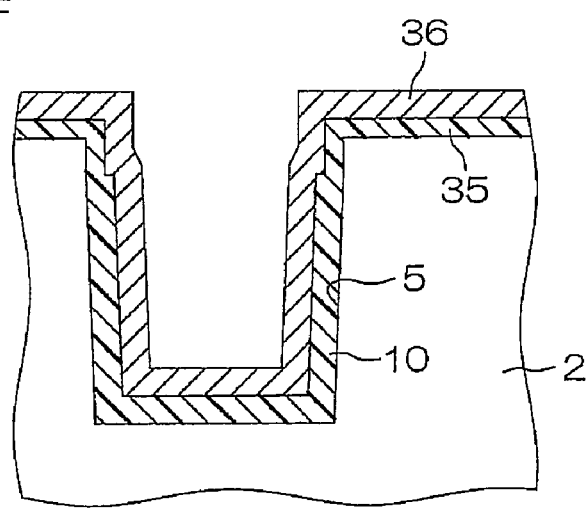
Figure 3G:
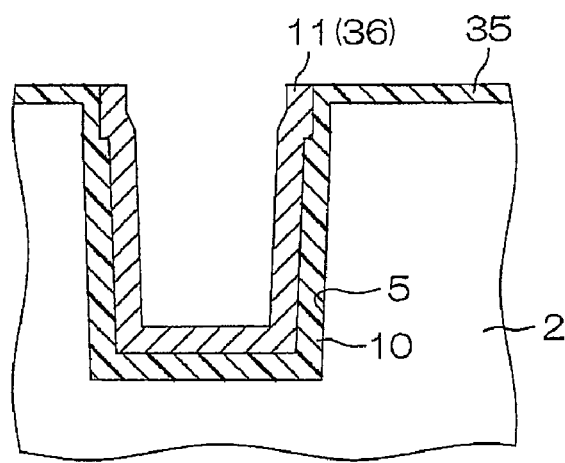
Figure 3H:
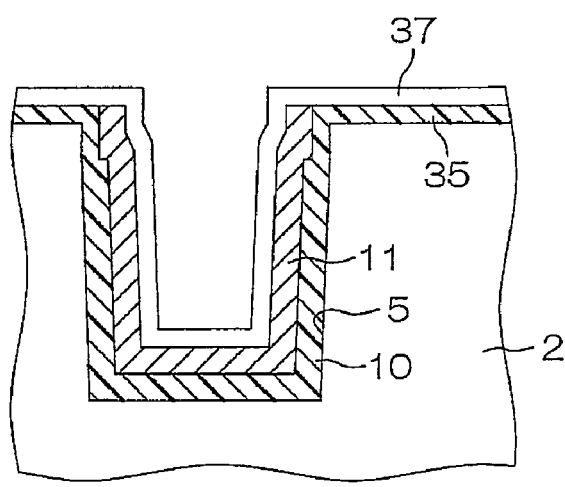
Figure 3I:
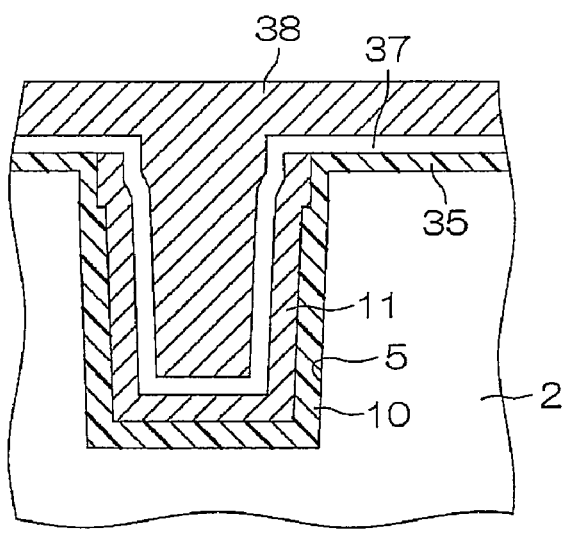
Figure 3J:
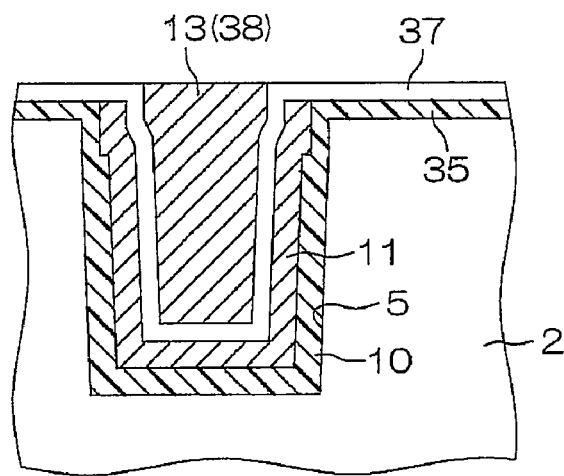
Figure 3K:
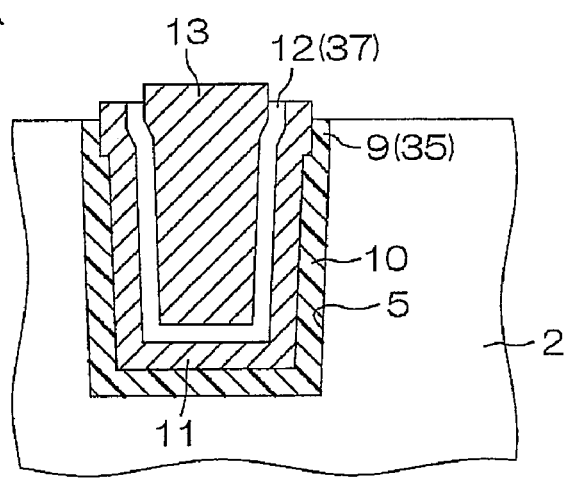
Figure 3L:
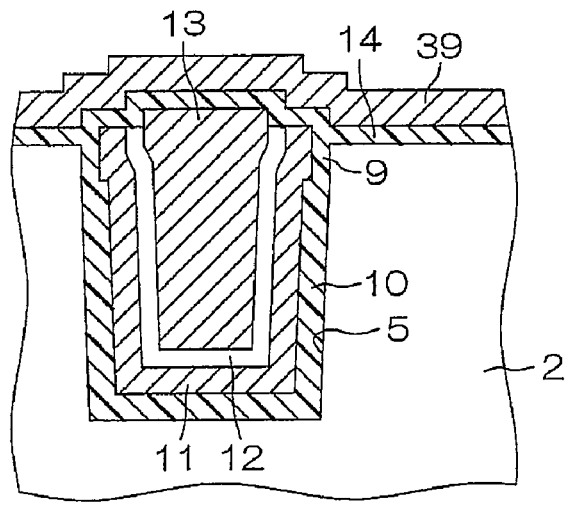
Figure 3M:
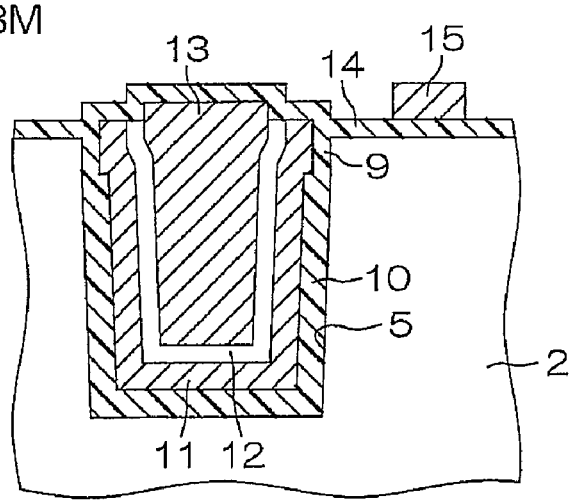
Figure 3N:
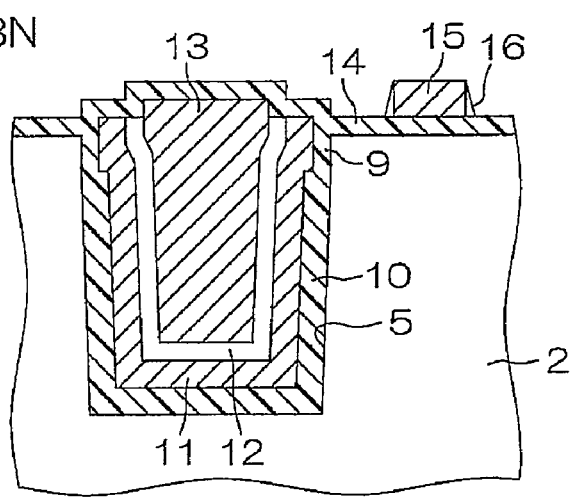
Figure 3O:
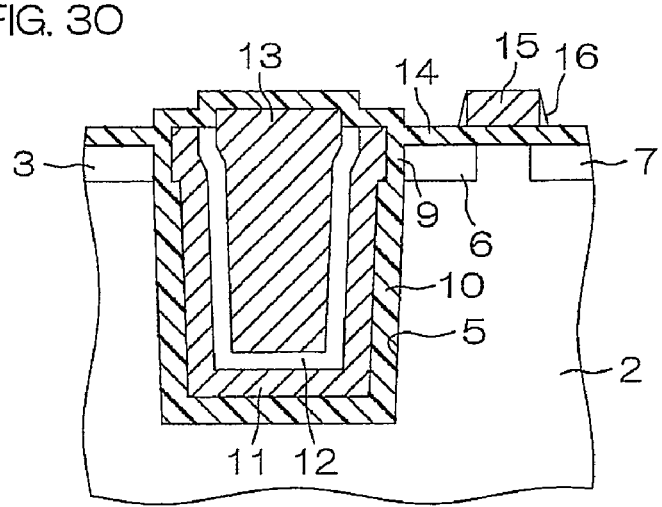

FIGS. 3A to 3O are schematic sectional views showing a method of manufacturing each memory cell in step order.

In the process of manufacturing each memory cell of the semiconductor device 1, a sacrificial oxide film made of silicon oxide is first formed on the surface of a P-type silicon substrate 31 by thermal oxidation, as shown in FIG. 3A. Then, a silicon nitride film is formed on the sacrificial oxide film by LPCVD (Low Pressure Chemical Vapor Deposition). The sacrificial oxide film and the silicon nitride film are patterned, to form a hard mask 32 having an opening in a portion opposed to a portion for forming the trench 5.

Thereafter the silicon substrate 31 is etched through the hard mask 32, as shown in FIG. 3B. Thus, a trench 33 is formed in the silicon substrate 31.

Then, thermal oxidation is performed while leaving the hard mask 32 on the silicon substrate 31, thereby forming the thick portion 10 made of silicon oxide on the inner surface of the trench 33. After the formation of the thick portion 10, the hard mask 32 is removed with phosphoric acid and hydrofluoric acid, as shown in FIG. 3C. Slight film loss is caused in the thick portion 10 when hydrofluoric acid is employed (when the sacrificial oxide film is removed).

Thereafter a P-type epitaxial layer 34 made of silicon is formed by epitaxy, as shown in FIG. 3D. The epitaxial layer 34 is not formed on the thick portion 10, but selectively formed only on the surface of the silicon substrate 31.

Then, an oxide film 35 is formed on the surface of the epitaxial layer 34 by thermal oxidation, as shown in FIG. 3E. The epitaxial layer 34 and the silicon substrate 31 provided under the same constitute the P-type semiconductor layer 2. The trench 33 partially forms the trench 5.

Thereafter a doped polysilicon film 36 is formed on the thick portion 10 and the oxide film 35 by LPCVD, as shown in FIG. 3F.

The doped polysilicon film 36 is partially removed by CMP (Chemical Mechanical Polishing) until the oxide film 35 is exposed, as shown in FIG. 3G. Consequently, the doped polysilicon film 36 remains on the trench 5, and the remaining doped polysilicon film 36 forms the floating gate 11.

Then, a silicon oxide film, a silicon nitride film and a silicon oxide film are successively stacked on the floating gate 11 and the oxide film 35 by oxidation and CVD, as shown in FIG. 3H. Thus, an ONO film 37 is formed on the floating gate 11 and the oxide film 35.

Then, doped polysilicon 38 is deposited on the ONO film 37 by LPCVD, as shown in FIG. 3I. The deposition of the doped polysilicon 38 is continued until the doped polysilicon 38 has a proper thickness on the ONO film 37 outside the trench 5.

The doped polysilicon 38 is planarized and partially removed by CMP or etch-back until the ONO film 37 is exposed, as shown in FIG. 3J. Consequently, the doped polysilicon 38 remains on the trench 5, and the remaining doped polysilicon 38 forms the control gate 13.

Thereafter the oxide film 35 and the ONO film 37 are partially removed from on a portion of the semiconductor layer 2 located outside the trench 5 with hydrofluoric acid or the like to be left only on the trench 5, as shown in FIG. 3K. The oxide film 35 left on the trench 5 forms the thin portion 9. The ONO film 37 left on the trench 5 forms the second insulating film 12.

Then, the third insulating film 14 is formed on the semiconductor layer 2, the thin portion 9, the floating gate 11, the second insulating film 12 and the control gate 13 by thermal oxidation to collectively cover the same, as shown in FIG. 3L. Further, a doped polysilicon film 39 is formed on the third insulating film 14 by LPCVD.

Thereafter the doped polysilicon film 39 is selectively removed (patterned) by photolithography and etching, as shown in FIG. 3M. Thus, the select gate 15 is formed.

After the formation of the select gate 15, a silicon nitride film is formed on the third insulating film 14 by LPCVD. The silicon nitride film is formed to have a thickness for burying the select gate 15 therein. The silicon nitride film is left only around the select gate 15 by etch-back to form the sidewall 16, as shown in FIG. 3N.

Thereafter an N-type impurity (arsenic ions, for example) is ion-implanted into the overall active region of the semiconductor layer 2 from the surface thereof. A heat treatment is performed for diffusing the N-type impurity, thereby forming the first diffusion region 3, the second diffusion region 6 and the third diffusion region 7 on the surface layer portion of the semiconductor layer 2, as shown in FIG. 3O. Thus, the memory cell of the semiconductor device 1 is obtained.

The thin portion 9 of the first insulating film 8 forms the tunnel window, and hence the portion of the first insulating film 8 forming the tunnel window may not be selectively etched, and no resist pattern is required therefor. In the semiconductor device 1, therefore, the number of reticles necessary for manufacturing the same can be reduced as compared with the semiconductor device (the EEPROM 121) having the structure shown in FIGS. 13 and 14. Consequently, the number of the manufacturing steps and the manufacturing cost can be reduced.

Figure 4:
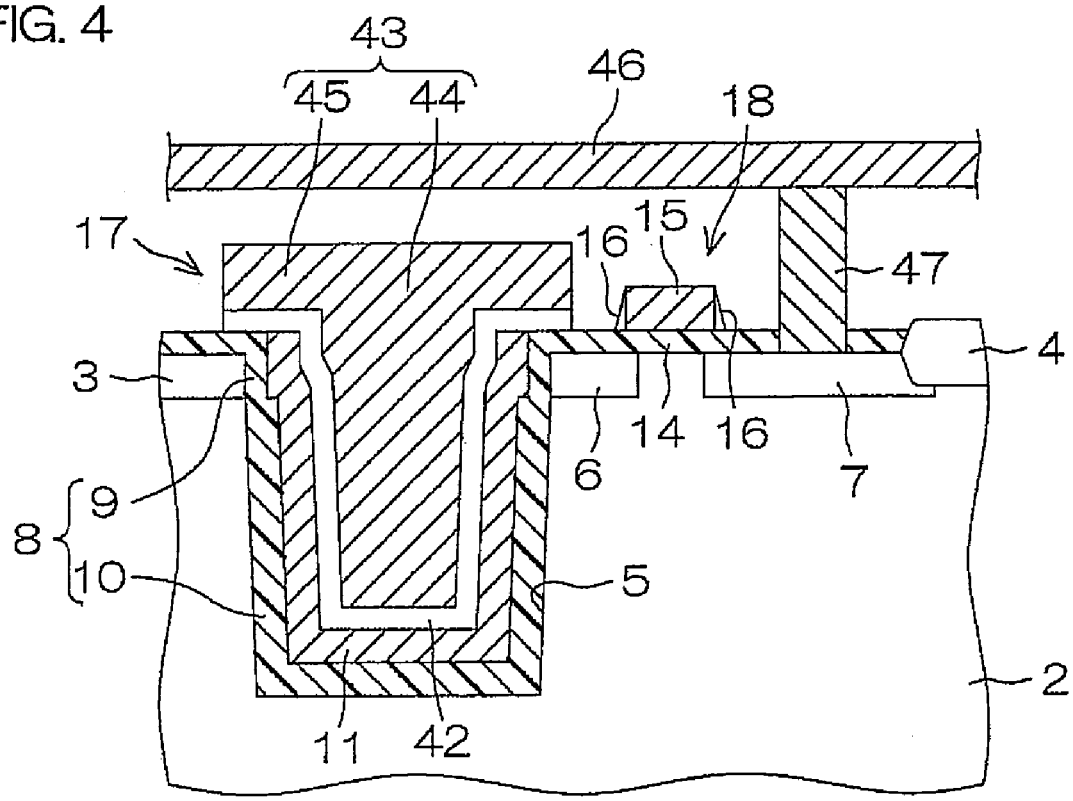
FIG. 4 is a schematic sectional view of a semiconductor device according to a second embodiment of the present invention.

FIG. 4 is a schematic sectional view of a semiconductor device according to a second embodiment of the present invention. Referring to FIG. 4, portions corresponding to those shown in FIG. 2 are denoted by the same reference numerals respectively. In relation to the structure shown in FIG. 4, the following description is made with reference to points different from those of the structure shown in FIG. 2, and redundant description is omitted as to the portions corresponding to those shown in FIG. 2.

In a semiconductor device 41 shown in FIG. 4, a third insulating film 14 covers only the surface of an active region of a semiconductor layer 2.

A second insulating film 42 having an ONO structure is formed on a floating gate 11. The upper end portion of the second insulating film 42 extends onto the floating gate 11, and is arranged on the third insulating film 14.

A control gate 43 made of doped polysilicon is provided on the second insulating film 42. The control gate 43 is generally T-shaped in section, fills up a recess formed on a trench 5 by the second insulating film 42, and has a prescribed thickness on the upper end portion of the second insulating film 42. In other words, the control gate 43 integrally has a body portion 44 arranged on the trench 5 so that the upper end portion protrudes upward from the trench 5 and an extending portion 45 extending sideward from the upper end portion of the body portion 44.

The extending portion 45 is opposed to the floating gate 11 in the depth direction of the trench 5. Therefore, the capacitance between the floating gate 11 and the control gate 43 can be increased due to the extending portion 45 provided on the control gate 43, and a coupling ratio R can be further improved.

In the semiconductor device 41, a word line extending in a direction Y can be formed by forming the upper end portion of the control gate 43 (the upper end portion of the body portion 44 and the extending portion 45) to extend in the direction Y and integrating the upper end portions of control gates 43 of memory cells arrayed in the direction Y. Thus, no word line 19 shown in FIG. 2 is required. Therefore, an inter layer dielectric film (not shown) is laminated on the third insulating film 14 and a bit line 46 extending in a direction X is provided on the inter layer dielectric film, and the bit line 46 can be connected in common to third diffusion regions 7 of the memory cells arrayed in the direction X under the bit line 46 through contact plugs 47. As compared with the semiconductor device 1 shown in FIG. 2, therefore, the number of wiring layers can be reduced by one, and the thickness of the semiconductor device 41 can be reduced.

FIGS. 5A to 5D are schematic sectional views for illustrating a method of manufacturing each memory cell of the semiconductor device 41 shown in FIG. 4.

The steps of manufacturing the semiconductor device 41 shown in FIG. 4 partially overlap with the steps of manufacturing the semiconductor device 1 shown in FIG. 1. In other words, the steps shown in FIGS. 3A to 3I are first successively carried out, in order to manufacture the semiconductor device 41.

Figure 5A:
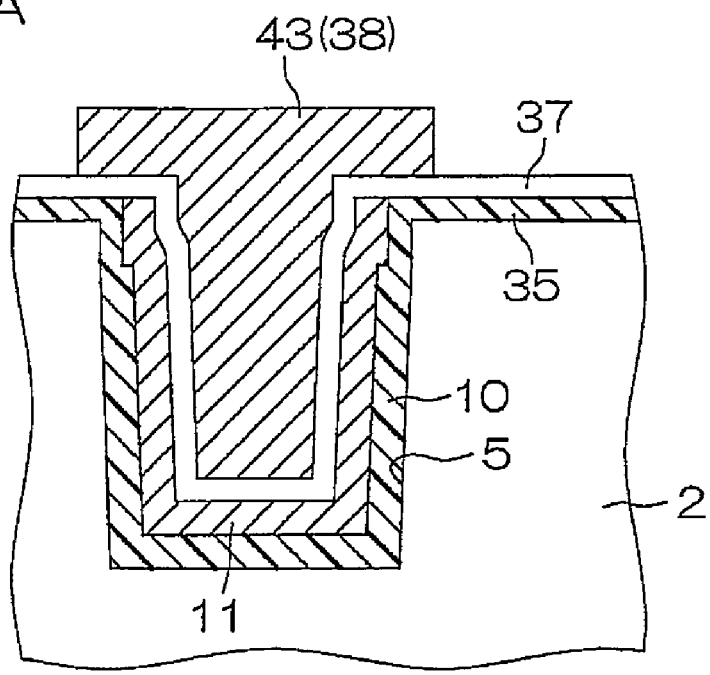
FIGS. 5A to 5D are schematic sectional views for illustrating a method of manufacturing a memory cell of the semiconductor device shown in FIG. 4 in step order.

After doped polysilicon 38 is deposited on an ONO film 37, the doped polysilicon 38 is selectively removed (patterned) by photolithography and etching to form the control gate 43, as shown in FIG. 5A.

Figure 5B:
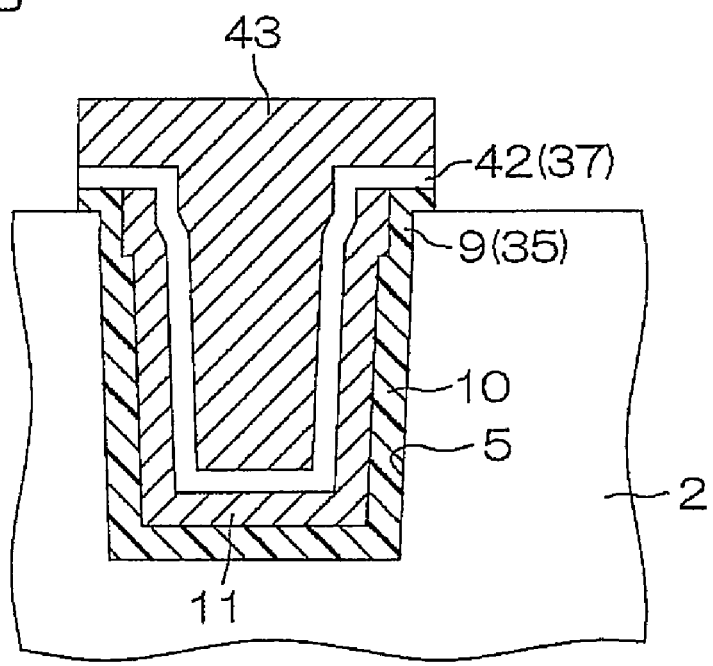

Then, a portion of the ONO film 37 exposed from the control gate 43 and a portion of an oxide film 35 located under the same are removed by RIE (Reactive Ion Etching) or the like, as shown in FIG. 5B. The oxide film 35 and the ONO film 37 left unremoved form a thin portion 9 an the second insulating film 42 respectively.

Figure 5C:
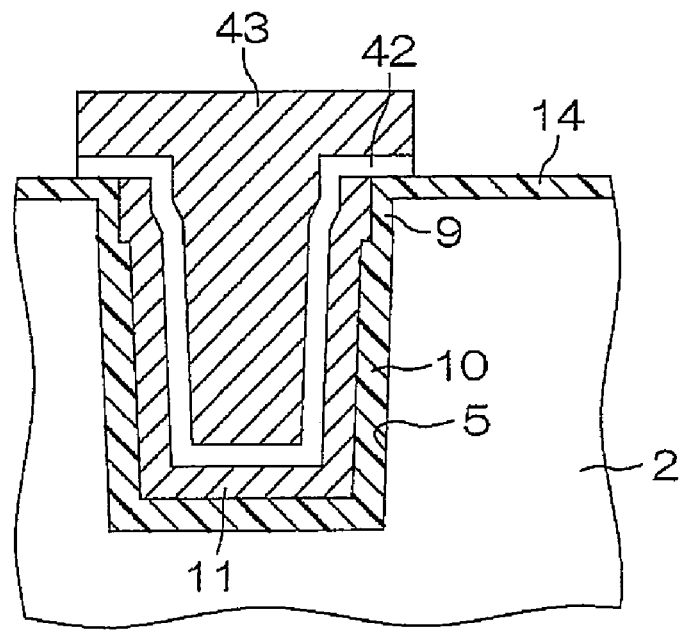

Thereafter the third insulating film 14 is formed on the semiconductor layer 2 by thermal oxidation, as shown in FIG. 5C.

Figure 5D:
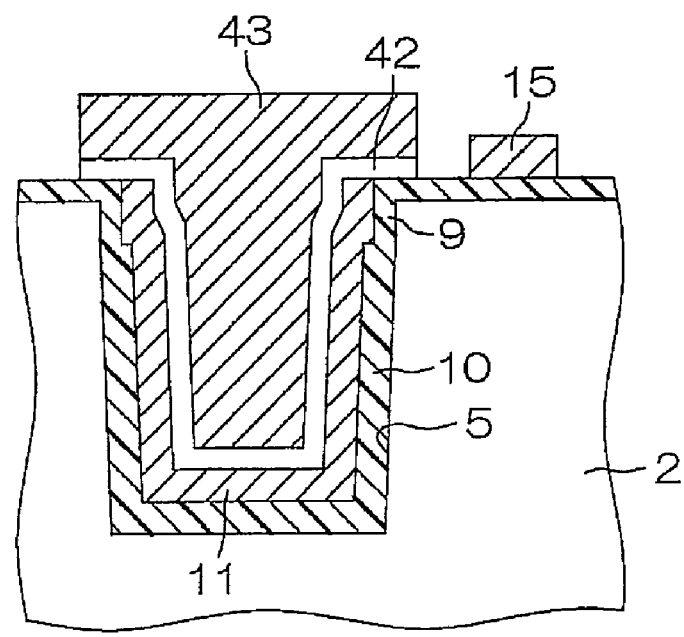

Then, a doped polysilicon film is formed on the third insulating film 14 by LPCVD, and the doped polysilicon film is selectively removed (patterned) by photolithography and etching. Thus, a select gate 15 is formed, as shown in FIG. 5D.

After the formation of the select gate 15, the steps shown in FIGS. 3N and 3O are successively carried out, to obtain the memory cell of the semiconductor device 41.

Figure 6:
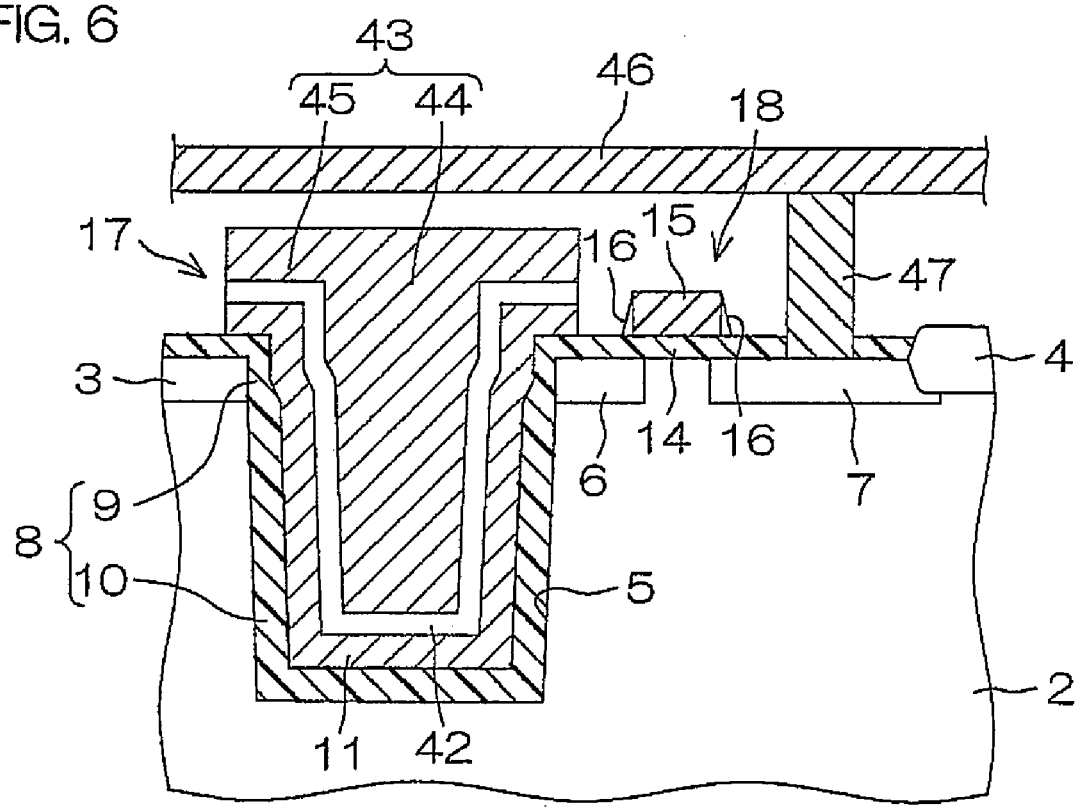
FIG. 6 is a schematic sectional view of a semiconductor device according to a third embodiment of the present invention.

FIG. 6 is a schematic sectional view of a semiconductor device according to a third embodiment of the present invention. Referring to FIG. 6, portions corresponding to those shown in FIG. 4 are denoted by the same reference numerals respectively. In relation to the structure shown in FIG. 6, the following description is made with reference to points different from those of the structure shown in FIG. 4, and redundant description is omitted as to the portions corresponding to those shown in FIG. 4.

In a semiconductor device 63 shown in FIG. 6, an upper end portion of a floating gate 11 is arranged on a third insulating film 14 at a peripheral portion of a trench 5. The portion of the floating gate 11 on the peripheral portion is sandwiched between the third insulating film 14 and a second insulating film 42.

Figure 7A:
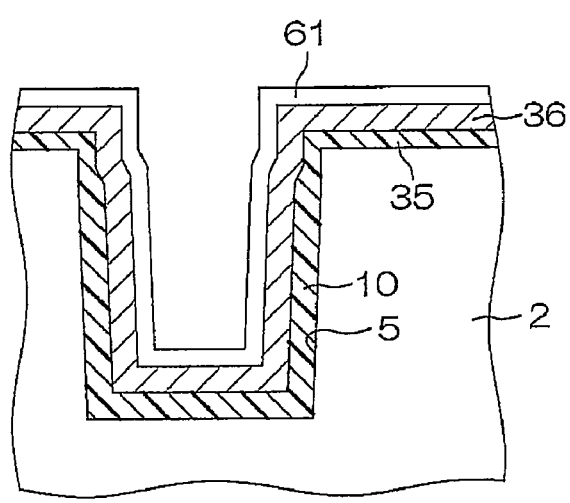
FIGS. 7A to 7C are schematic sectional views for illustrating another method of manufacturing a memory cell of the semiconductor device shown in FIG. 6 in step order.
Figure 7B:
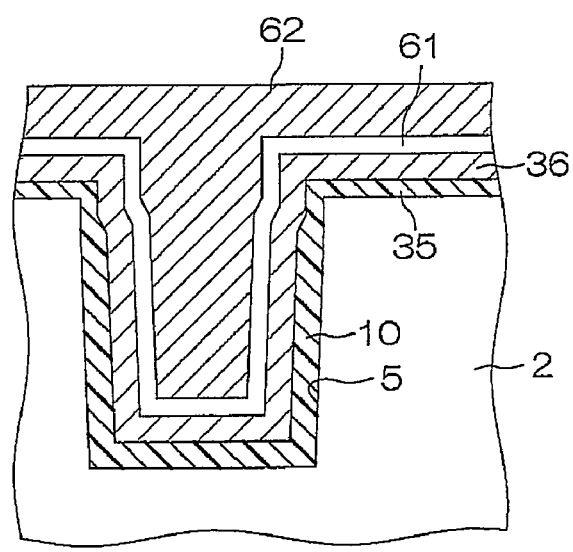
Figure 7C:
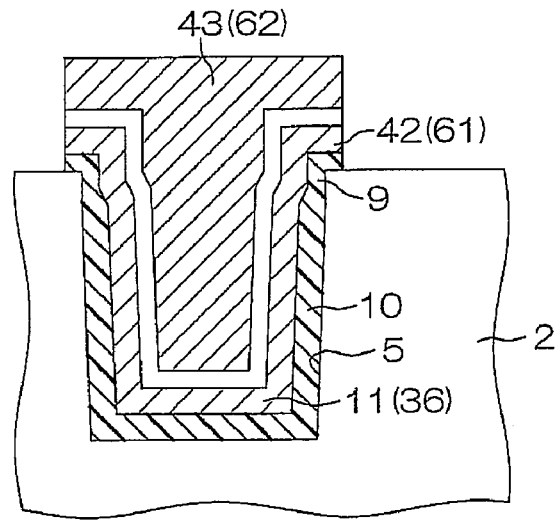

FIGS. 7A to 7C are schematic sectional views for illustrating another method of manufacturing each memory cell of the semiconductor device 63 shown in FIG. 6.

According to the method, the steps shown in FIGS. 3A to 3F are first successively carried out.

After formation of a doped polysilicon film 36, an ONO film 61 having an ONO structure is laminated on the doped polysilicon film 36 by oxidation and CVD, as shown in FIG. 7A.

Then, doped polysilicon 62 is deposited on the ONO film 61 by LPCVD, as shown in FIG. 7B. The deposition of the doped polysilicon 62 is continued until the doped polysilicon 62 has a proper thickness on the ONO film 61 outside the trench 5.

Then, the doped polysilicon 62 is selectively removed (patterned) by photolithography and etching to form the control gate 43, as shown in FIG. 7C. A portion of the ONO film 61 exposed from the control gate 43 is removed by RIE or the like. Further, a portion of the doped polysilicon film 36 exposed through the removal of the ONO film 61 and a portion of the oxide film 35 located under the same are removed with hydrofluoric acid or the like. The oxide film 35, the doped polysilicon film 36 and the ONO film 61 left unremoved form the thin portion 9, the floating gate 11 and the second insulating film 42 respectively.

Thereafter the steps shown in FIGS. 5D and 3N and 3O are successively carried out, to obtain the memory cell of the semiconductor device 63.

Figure 8:
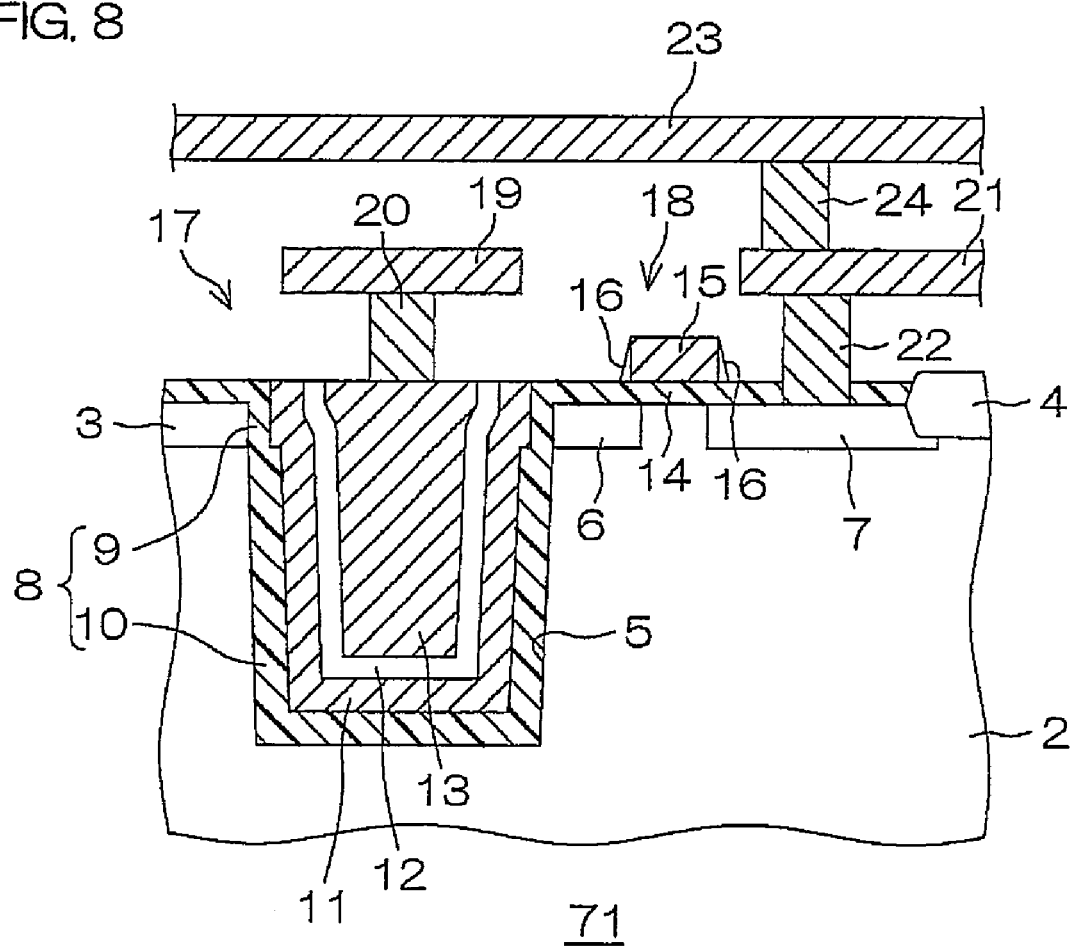
FIG. 8 is a schematic sectional view of a semiconductor device according to a forth embodiment of the present invention.

FIG. 8 is a schematic sectional view of a semiconductor device according to a forth embodiment of the present invention. Referring to FIG. 8, portions corresponding to those shown in FIG. 2 are denoted by the same reference numerals respectively. In relation to the structure shown in FIG. 8, the following description is made with reference to points different from those of the structure shown in FIG. 2, and redundant description is omitted as to the portions corresponding to those shown in FIG. 2.

In the semiconductor device 1 shown in FIG. 2, the upper end portions of the floating gate 11, the second insulating film 12 and the control gate 13 protrude upward from the trench 5, and are covered with the third insulating film 14.

In a semiconductor device 71 shown in FIG. 8, on the other hand, a third insulating film 14 covers only the surface of an active region of a semiconductor layer 2. The upper surfaces of a floating gate 11, a second insulating film 12 and a control gate 13 are generally flush with the surface of the third insulating film 14.

Also according to the structure of the semiconductor device 71, effects similar to those of the semiconductor device 1 shown in FIG. 2 can be attained.

Figure 9A:
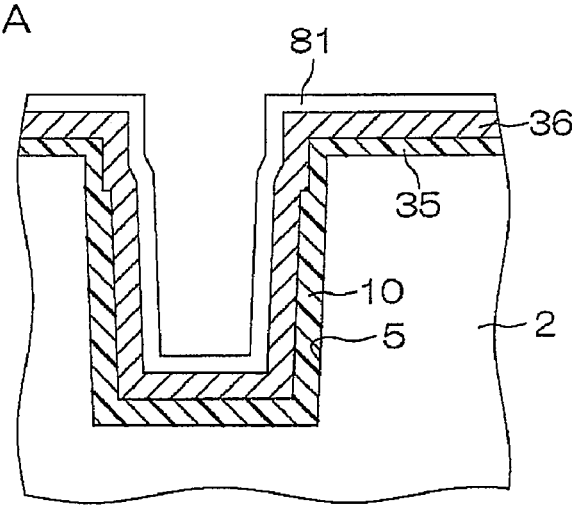
FIGS. 9A to 9C are schematic sectional views for illustrating a method of manufacturing a memory cell of the semiconductor device shown in FIG. 8 in step order.
Figure 9B:
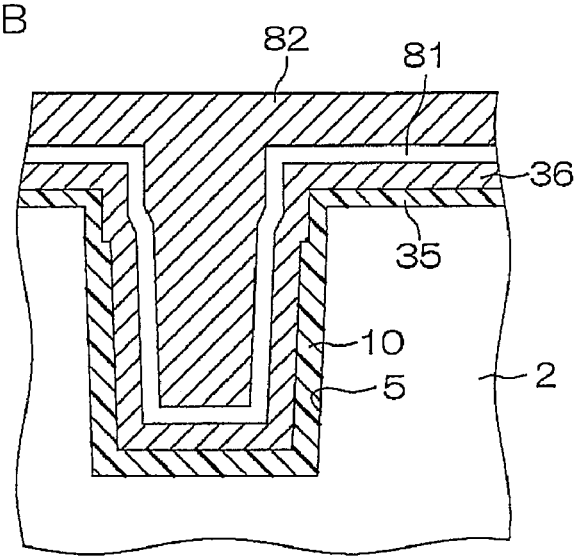
Figure 9C:
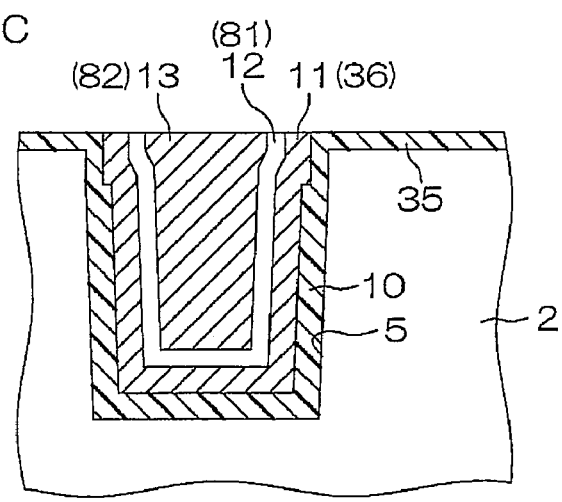

FIGS. 9A to 9C are schematic sectional views for illustrating a method of manufacturing each memory cell of the semiconductor device 71 shown in FIG. 8.

The steps of manufacturing the semiconductor device 71 shown in FIG. 8 partially overlap with the steps of manufacturing the semiconductor device 1 shown in FIG. 2. In other words, the steps shown in FIGS. 3A to 3F are first successively carried out, in order to manufacture the semiconductor device 71.

After formation of a doped polysilicon film 36, an ONO film 81 having an ONO structure is laminated on the doped polysilicon film 36 by oxidation and CVD, as shown in FIG. 9A.

Then, doped polysilicon 82 is deposited on the ONO film 81 by LPCVD, as shown in FIG. 9B. The deposition of the doped polysilicon 82 is continued until the doped polysilicon 82 has a proper thickness on the ONO film 81 outside a trench 5.

Thereafter the doped polysilicon 82, the ONO film 81 and the doped polysilicon film 36 are successively partially removed by CMP or etch-back until an oxide film 35 is exposed, as shown in FIG. 9C. When the oxide film 35 is exposed, the doped polysilicon 82, the ONO film 81 and the doped polysilicon film 36 remain only on the trench 5, to form the control gate 13, the second insulating film 12 and the floating gate 11 respectively.

Thereafter the oxide film 35 is removed from a portion of the semiconductor layer 2 located outside the trench 5 with hydrofluoric acid or the like, so that the oxide film 35 left on the side surfaces of the trench 5 form a thin portion 9. Then, the steps shown in FIGS. 3L to 3O are successively carried out, to obtain the memory cell of the semiconductor device 71.

Figure 10:
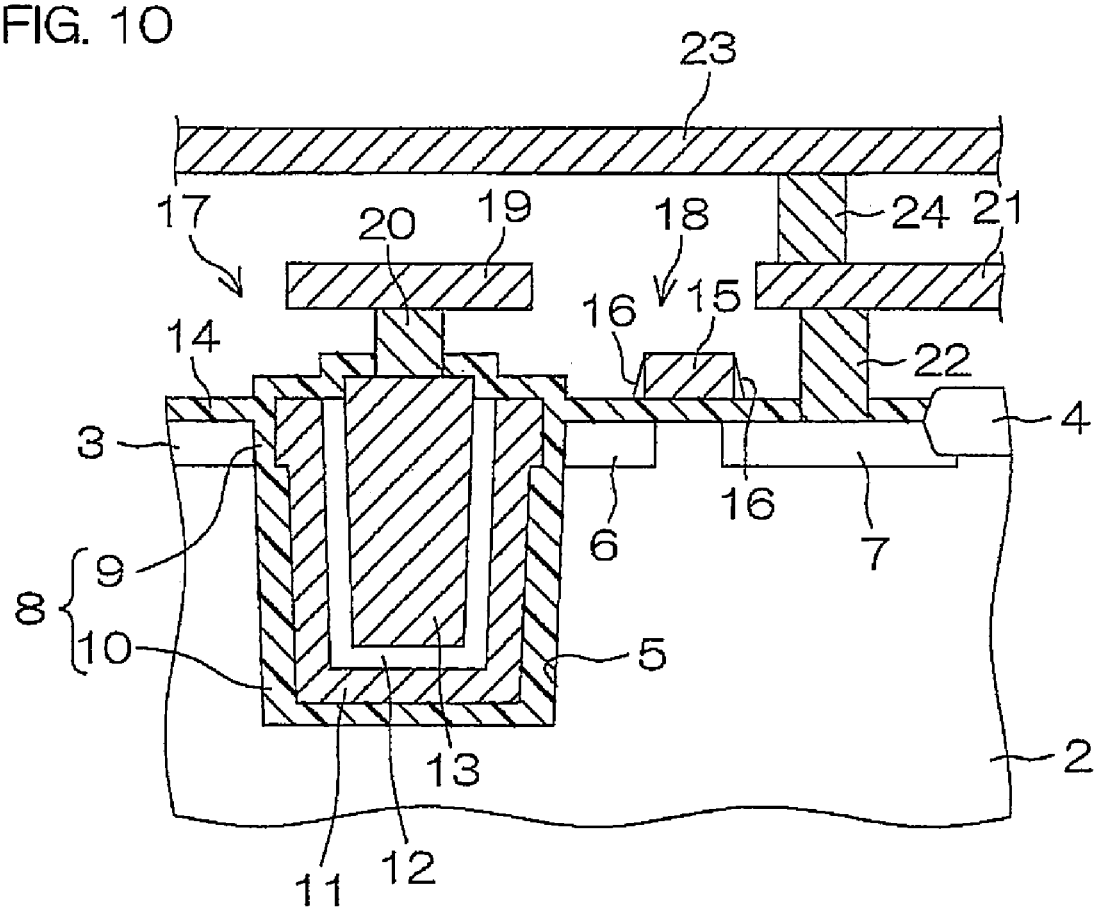
FIG. 10 is a schematic sectional view of a semiconductor device according to a fifth embodiment of the present invention.

FIG. 10 is a schematic sectional view of a semiconductor device according to a fifth embodiment of the present invention. Referring to FIG. 10, portions corresponding to those shown in FIG. 2 are denoted by the same reference numerals respectively. In relation to the structure shown in FIG. 10, the following description is made with reference to points different from those of the structure shown in FIG. 2, and redundant description is omitted as to the portions corresponding to those shown in FIG. 2.

In a semiconductor device 91 shown in FIG. 10, the thickness of a first insulating film 8 on the bottom surface of a trench 5 is small as compared with that in the semiconductor device 1 shown in FIG. 1. The difference in thickness results from difference between a manufacturing method described below and the manufacturing method shown in FIGS. 3A to 3O.

Figure 11A:
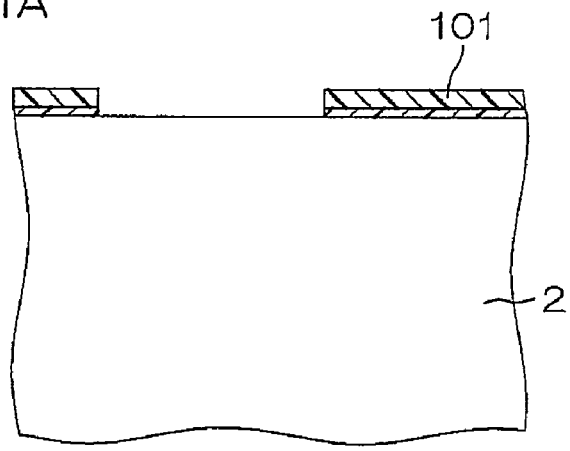
FIGS. 11A to 11O are schematic sectional views for illustrating a method of manufacturing a memory cell of the semiconductor device shown in FIG. 9 in step order.
Figure 11B:
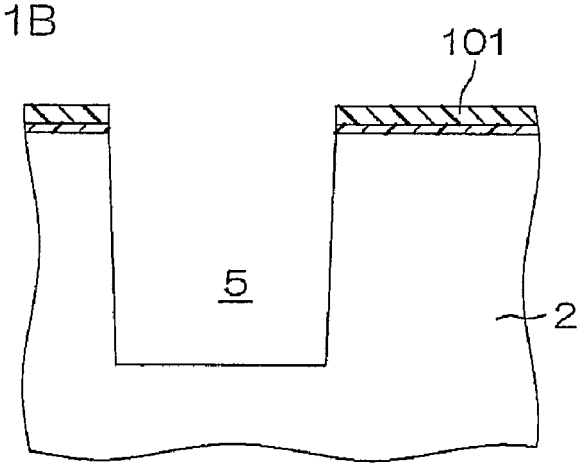
Figure 11C:
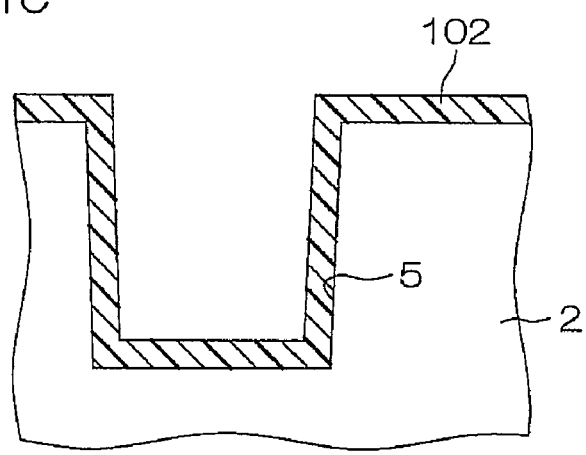
Figure 11D:
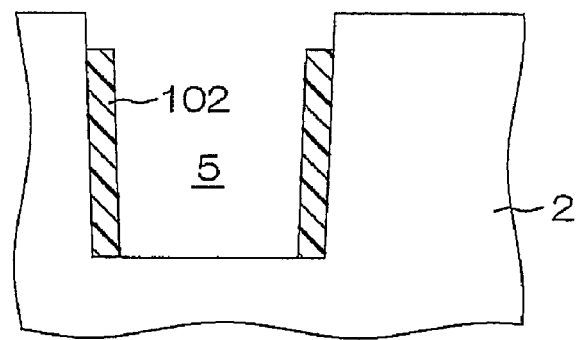
Figure 11E:
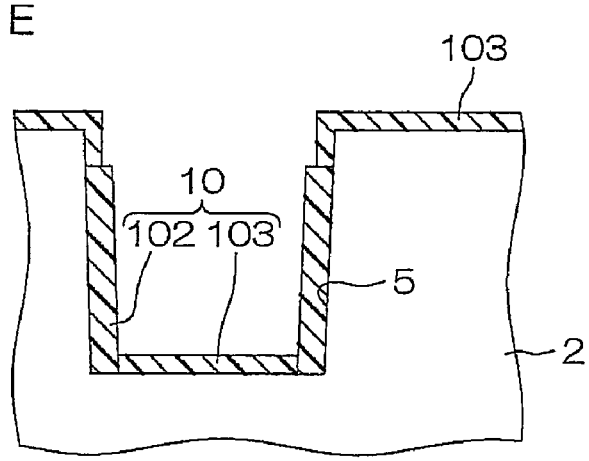
Figure 11F:
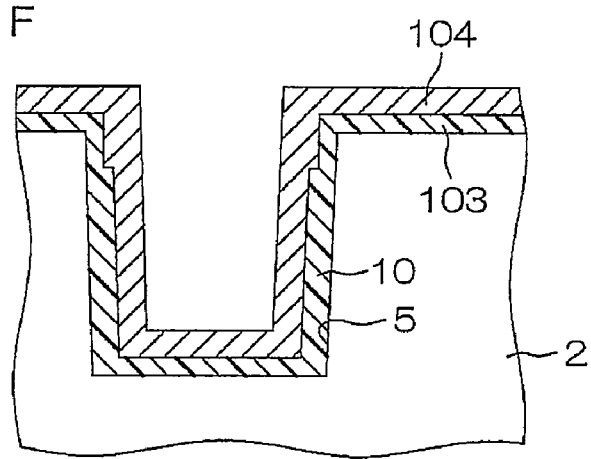
Figure 11G:
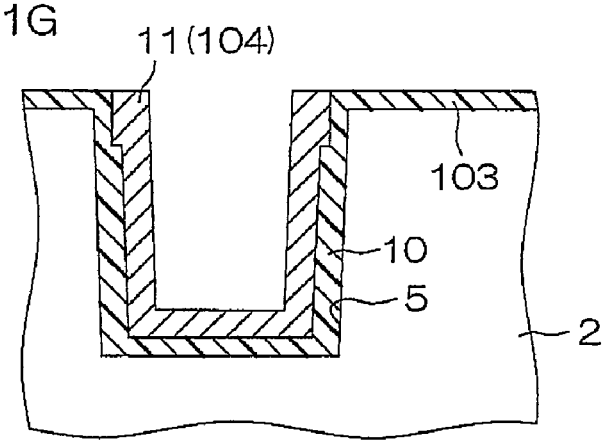
Figure 11H:
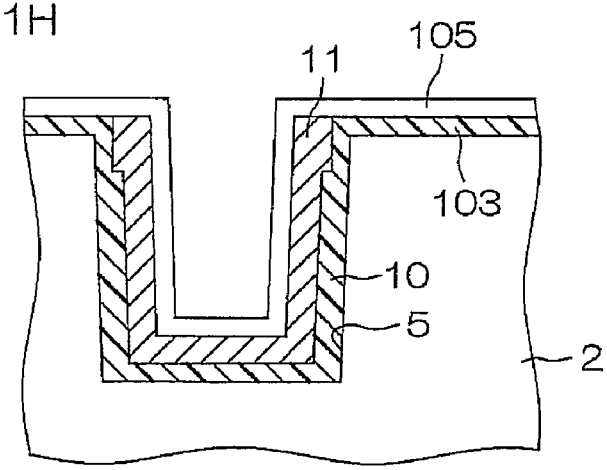
Figure 11I:
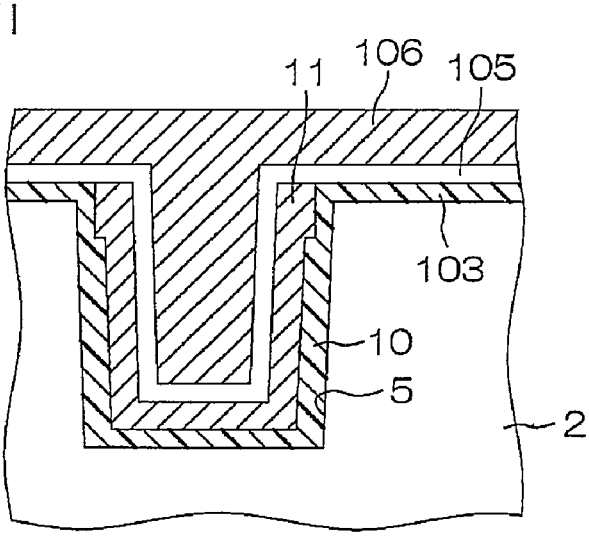
Figure 11J:
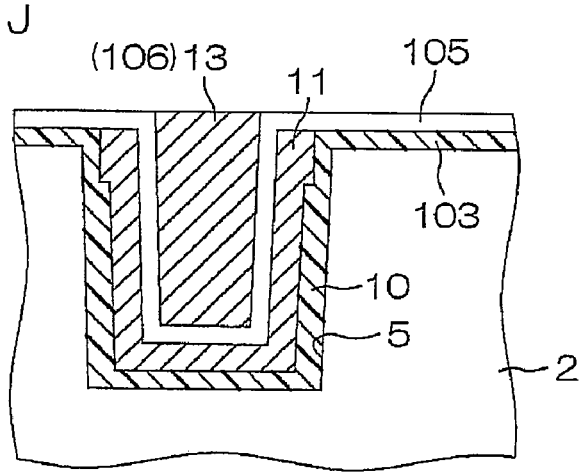
Figure 11K:
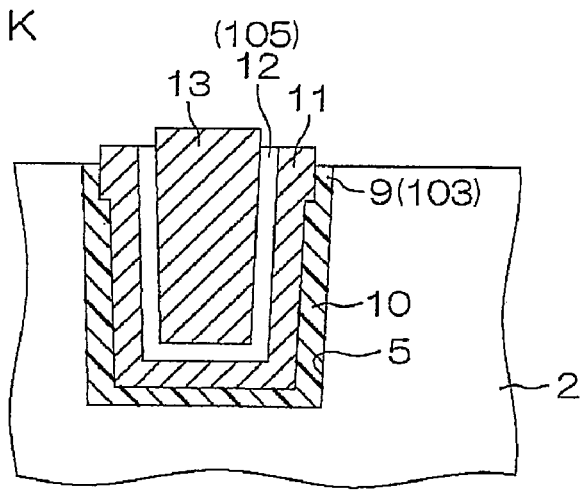
Figure 11L:
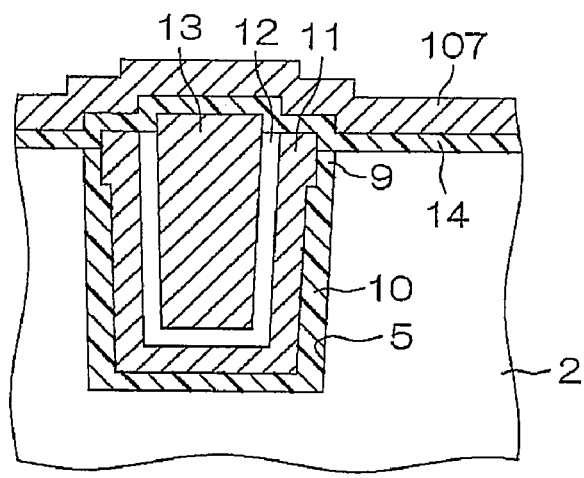
Figure 11M:
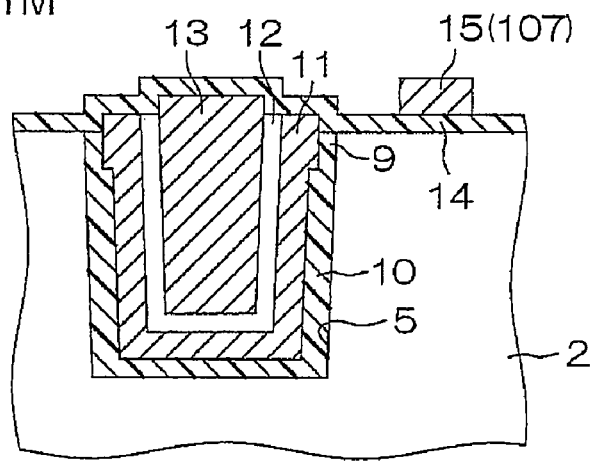
Figure 11N:
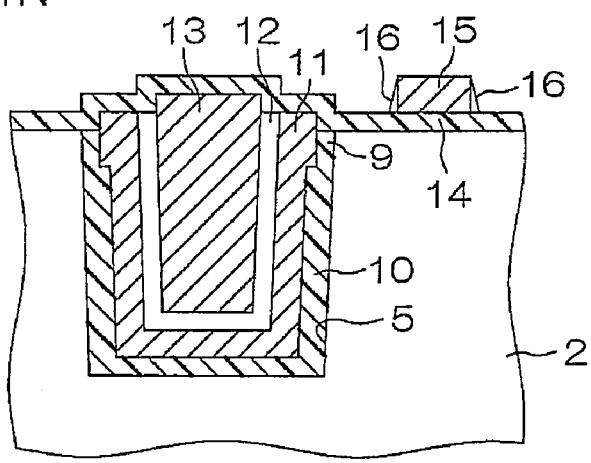
Figure 11O:
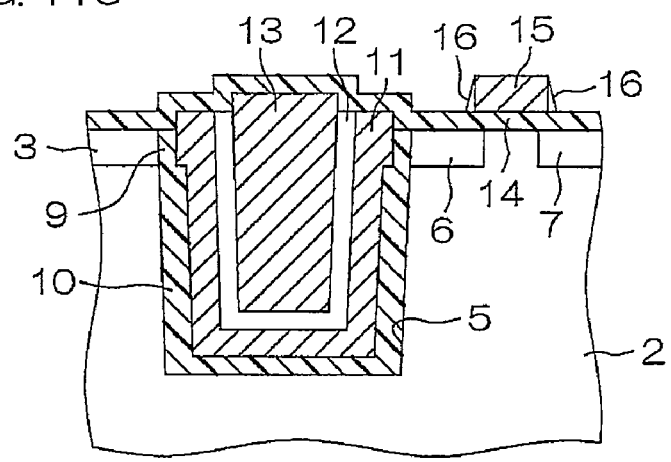

FIGS. 11A to 11O are schematic sectional views for illustrating a method of manufacturing each memory cell of the semiconductor device 91 shown in FIG. 10.

In the process of manufacturing the memory cell of the semiconductor device 91 shown in FIG. 10, a sacrificial oxide film made of silicon oxide is first formed on the surface of a semiconductor layer 2 by thermal oxidation, as shown in FIG. 11A. Then, a silicon nitride film is formed on the sacrificial oxide film by LPCVD. Then, a hard mask 101 having an opening in a portion opposed to a portion for forming the trench 5 is formed by patterning the sacrificial oxide film and the silicon nitride film.

Thereafter a silicon substrate 31 is etched through the hard mask 101, as shown in FIG. 11B. Thus, the trench 5 is formed in the silicon substrate 31. After the formation of the trench 5, the hard mask 101 is removed with phosphoric acid and hydrofluoric acid.

Then, an oxide film 102 is formed on the overall surface of the silicon substrate 31 including the inner surface of the trench 5 by thermal oxidation, as shown in FIG. 11C.

Thereafter the oxide film 102 is removed from the bottom surface of the trench 5, the side surfaces of an opening-side end portion thereof and a portion of the silicon substrate 31 located outside the trench 5 by etch-back and washing so that the oxide film 102 is left only on the side surfaces of the trench 5, as shown in FIG. 11D.

Then, an oxide film 103 is formed on the bottom surface of the trench 5 and the surface of the portion of the silicon substrate 31 located outside the trench 5 by thermal oxidation, as shown in FIG. 11E. The oxide film 102 left on the side surfaces of the trench 5 and the oxide film 103 left on the bottom surface of the trench 5 are integrated into a thick portion 10.

Thereafter a doped polysilicon film 104 is formed on the thick portion 10 and the oxide film 103 by LPCVD, as shown in FIG. 11F.

The doped polysilicon film 104 is partially removed by CMP until the oxide film 103 is exposed, as shown in FIG. 11G. Consequently, the doped polysilicon film 104 remains on the trench 5, and the remaining doped polysilicon film 104 forms the floating gate 11.

Then, an ONO film 105 having an ONO structure is formed on the floating gate 11 and the oxide film 103 by CVD, as shown in FIG. 11H.

Then, doped polysilicon 106 is deposited on the ONO film 105 by LPCVD, as shown in FIG. 11I. The deposition of the doped polysilicon 106 is continued until the doped polysilicon 106 has a proper thickness on the ONO film 105 outside the trench 5.

The doped polysilicon 106 is planarized and partially removed by CMP or etch-back until the ONO film 105 is exposed, as shown in FIG. 11J. Consequently, the doped polysilicon 106 remains on the trench 5, and the remaining doped polysilicon 106 forms the control gate 13.

Thereafter the oxide film 103 and the ONO film 105 are removed from a portion of the semiconductor layer 2 located outside the trench 5 with hydrofluoric acid or the like so that the oxide film 103 and the ONO film 105 are left only on the trench 5, as shown in FIG. 11K. The oxide film 103 left on the trench 5 forms the thin portion 9. The ONO film 105 left on the trench 5 forms the second insulating film 12.

Then, a third insulating film 14 is formed on the semiconductor layer 2, the thin portion 9, the floating gate 11, the second insulating film 12 and the control gate 13 by thermal oxidation to collectively cover the same, as shown in FIG. 11L. Further, a doped polysilicon film 107 is formed on the third insulating film 14 by LPCVD.

Thereafter the doped polysilicon film 107 is selectively removed (patterned) by photolithography and etching, as shown in FIG. 11M. Thus, a select gate 15 is formed.

After the formation of the select gate 15, a silicon nitride film is formed on the third insulating film 14 by LPCVD. The silicon nitride film is formed in a thickness for burying the select gate 15 therein. The silicon nitride film is left only around the select gate 15 by etch-back to form a sidewall 16, as shown in FIG. 11N.

Thereafter an N-type impurity (arsenic ions, for example) is ion-implanted into the whole area of an active region of the semiconductor layer 2 from the surface thereof. A heat treatment is performed for diffusing the N-type impurity, thereby forming a first diffusion region 3, a second diffusion region 6 and a third diffusion region 7 on the surface layer portion of the semiconductor layer 2, as shown in FIG. 11O. Thus, the memory cell of the semiconductor device 91 is obtained.

Figure 12:
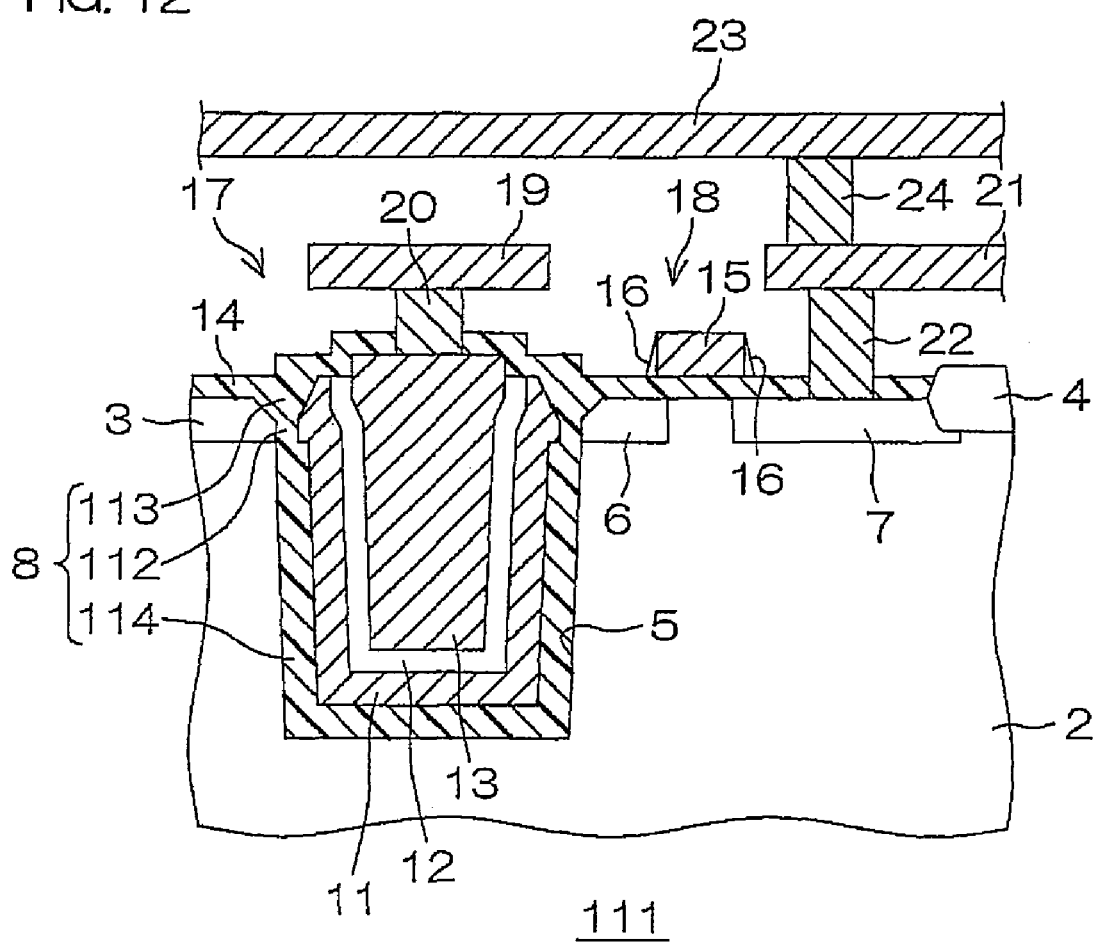
FIG. 12 is a schematic sectional view of a semiconductor device according to a sixth embodiment of the present invention.

FIG. 12 is a schematic sectional view of a semiconductor device according to a sixth embodiment of the present invention. Referring to FIG. 12, portions corresponding to those shown in FIG. 2 are denoted by the same reference numerals respectively. In relation to the structure shown in FIG. 12, the following description is made with reference to points different from those of the structure shown in FIG. 2, and redundant description is omitted as to the portions corresponding to those shown in FIG. 2.

In a semiconductor device 111 shown in FIG. 12, a first insulating film 8 integrally includes a thin portion 112 in contact with a first diffusion region 3 and a second diffusion region 6, a first thick portion 113 formed on side surfaces of an opening-side end portion of a trench 5 to be continuous with the thin portion 112 and a second thick portion 114 formed on a side opposite to the first thick portion 113 through the thin portion 112 to be continuous with the thin portion 112. The first thick portion 113 and the second thick portion 114 have thicknesses larger than that of the thin portion 112.

According to the structure, the first thick portion 113 is formed on the side surfaces of the opening-side end portion of the trench 5, whereby the thin portion 112 and the first thick portion 113 are in contact with the second diffusion region 6 (a drain region of a memory transistor 17). Thus, the size of the thin portion 112 causing FN tunneling is reduced, whereby undesired charge escape from a floating gate 11 can be suppressed. Further, a large size can be ensured for a portion (a portion obtained by combining the first thick portion 113 and the second thick portion 114 with each other) having a thickness larger than that of the thin portion 112, and a coupling ratio can be further improved.

When the hydrofluoric acid is continuously supplied after the oxide film 35 is removed from the portion of the semiconductor layer 2 located outside the trench 5 in the step shown in FIG. 3K so that the oxide film 35 is removed also from the side surfaces of the opening-side end portion of the trench 5, the first thick portion 113 can be spontaneously formed by thermal oxidation in the step shown in FIG. 3L.

While some embodiments of the present invention have been described, the present invention may be embodied in other ways. For example, while the EEPROM is employed in each of the aforementioned embodiments, the present invention can be applied to a structure including a floating gate nonvolatile storage element such as a flash memory, an EPROM (Erasable Programmable Read Only Memory) or a DRAM (Dynamic Random Access Memory) other than the EEPROM.

The conductivity types of the semiconductor portions of the semiconductor devices 1, 41, 71, 91 and 111 may be reversed. In other words, the P-type portions may be replaced with N-type portions and vice versa in the semiconductor devices 1, 41, 71, 91 and 111.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-135514 filed with the Japan Patent Office on May 23, 2008, the disclosure of this application is incorporated herein by reference.

What is claimed is:

1. A semiconductor device, comprising:
   a semiconductor layer;
   a trench dug downward from the surface of the semiconductor layer, the trench having a bottom surface and a side surface;
   a source region formed in a surface layer portion of the semiconductor layer adjacently to a first side of the trench in a prescribed direction;
   a drain region formed in the surface layer portion of the semiconductor layer adjacently to a second side of the trench opposite to the first side in the prescribed direction;
   a first insulating film formed on the bottom surface and the side surface of the trench;
   a floating gate stacked on the first insulating film and opposed to the bottom surface and the side surface of the trench through the first insulating film, the floating gate extending over the source region and the drain region so as to cover only a portion of the source region and only a portion of the drain region;
   a second insulating film formed on the floating gate such that the second insulating film has a shape that substantially copies that of the first insulating film; and
   a control gate that is at least partially embedded in the trench, so that a portion embedded in the trench is opposed to the floating gate through the second insulating film, and that has a planarized top surface,
   wherein the first insulating film has a thin portion, having a relatively small thickness, in contact with the drain region, and a thick portion, having a relatively large thickness, formed by the remaining portion of the first insulating film other than the thin portion, the thick portion covering the entire bottom surface of the trench.

2. The semiconductor device according to claim 1, wherein the floating gate, the second insulating film and the control gate protrude beyond an upper end of the trench.

3. The semiconductor device according to claim 1, wherein the control gate integrally has a body portion arranged on the trench to protrude from the trench and an extending portion extending sideward from the body portion.

4. The semiconductor device according to claim 3, further comprising a third insulating film laminated on the semiconductor layer, wherein
   an upper end portion of the floating gate is arranged on the third insulating film at an outside periphery of the trench, and
   an upper end portion of the second insulating film extends onto the upper end portion of the floating gate under the extending portion of the control gate.

5. The semiconductor device according to claim 4, wherein the extending portion of the control gate, the upper end portion of the floating gate and the upper end portion of the second insulating film have respective end surfaces that are flush with each other.

6. The semiconductor device according to claim 3, wherein the extending portion of the control gate overlaps with a portion of the drain region when viewed in a depth direction of the trench.

7. The semiconductor device according to claim 3, wherein the second insulating film has an ONO structure having a nitride film sandwiched between a pair of oxide films.

8. The semiconductor device according to claim 3, further comprising a select transistor having a source region which is common with the drain region.

9. The semiconductor device according to claim 8, wherein the select transistor has a gate insulating film which is integral with the first insulating film.

10. The semiconductor device according to claim 1, further comprising:
    in addition to the trench as a first trench, a second trench dug downward from the surface of the semiconductor layer, the second trench having a bottom surface and a side surface, the second trench arranged in the semiconductor layer with the source region intervening between the first trench and the second trench;

a third insulating film formed on the bottom surface and the side surface of the second trench;
a second floating gate stacked on the third insulating film and opposed to the bottom surface and the side surface of the second trench through the third insulating film;
a fourth insulating film formed on the second floating gate; and
a second control gate at least partially embedded in the second trench so that a portion embedded in the second trench is opposed to the second floating gate through the fourth insulating film.

* * * * *